United States Patent
Matsunaga et al.

(10) Patent No.: US 6,759,906 B2
(45) Date of Patent: Jul. 6, 2004

(54) HIGH FREQUENCY POWER AMPLIFIER CIRCUIT DEVICE

(75) Inventors: Yoshikuni Matsunaga, Hachiouji (JP); Toshihiko Shimizu, Tokorozawa (JP); Tomio Furuya, Sawa (JP); Nobuhiro Matsudaira, Chigasaki (JP); Koichi Matsushita, Komoro (JP)

(73) Assignees: Renesas Technology Corp., Tokyo (JP); Hitachi Communication Systems, Inc., Kanagawa (JP)

( * ) Notice: Subject to any disclaimer, the term of this patent is extended or adjusted under 35 U.S.C. 154(b) by 0 days.

(21) Appl. No.: 10/170,376

(22) Filed: Jun. 14, 2002

(65) Prior Publication Data

US 2003/0016082 A1 Jan. 23, 2003

(30) Foreign Application Priority Data

Jul. 23, 2001 (JP) ........................................ 2001-221065

(51) Int. Cl.[7] ................................................ H03G 3/30
(52) U.S. Cl. ........................................ 330/285; 330/133
(58) Field of Search ................................ 330/133, 134, 330/285, 296, 310

(56) References Cited

U.S. PATENT DOCUMENTS

| 5,994,963 | A | | 11/1999 | Kawai et al. | ................ | 330/277 |
| 6,172,567 | B1 | * | 1/2001 | Ueno et al. | ................. | 330/285 |
| 6,333,675 | B1 | * | 12/2001 | Saito | ........................... | 330/133 |

FOREIGN PATENT DOCUMENTS

JP              11-275465           10/1999

* cited by examiner

*Primary Examiner*—Steven J. Mottola
(74) *Attorney, Agent, or Firm*—Mattingly, Stanger & Malur, P.C.

(57) ABSTRACT

A multistage high frequency power amplifier circuit device has a plurality of semiconductor amplification elements connected in a cascade. The circuit device is provided with a bias control circuit used to control the bias voltage or bias current of the output semiconductor amplification element in each stage so as to reduce the variation of the output power with respect to the power control signal voltage in an area around the threshold voltage of the semiconductor amplification elements. This realizes a high frequency power amplifier circuit device provided with excellent controllability of the output power and high efficiency at the time of low power output realized with use of such a control voltage as a power control signal.

9 Claims, 14 Drawing Sheets f=880MHz
Vdd=3.5V
Pin=0dBm f=880MHz
Vdd=3.5V
Pin=0dBm f=880MHz
Vdd=3.5V
Pin=0dBm

HIGH FREQUENCY POWER AMPLIFIER CIRCUIT DEVICE

BACKGROUND OF THE INVENTION

The present invention relates to a technique employable effectively for multistage high frequency power amplifier circuit devices, each having a plurality of semiconductor amplification elements connected in a cascade, as well as for such radio communication apparatuses as portable telephones, etc. in which such a high frequency power amplifier circuit device is built respectively. More particularly, the present invention relates to a technique for improving the controllability of an output power (gain) with use of a power control signal voltage of the high frequency power amplifier circuit device and the efficiency of the device at a low power output.

In such radio communication apparatuses (mobile communication apparatuses) as mobile telephones, portable telephones, etc., a multistage high frequency power amplifier circuit device is built in the transmission side output stage respectively. The high frequency power amplifier circuit device includes semiconductor amplification elements such as MOSFETs (Metal Oxide Semiconductor Field-Effect-Transistors) and FaAs-MESFETs, etc., which are connected in a cascade. In the high frequency power amplifier circuit device, the semiconductor amplification element in the last stage is usually composed of discrete parts (an output power MOSFET, etc.) and the semiconductor amplification element in the preceding stage and the bias circuit are often integrated into a semiconductor integrated circuit formed on one semiconductor chip. Hereinafter, a component in which a semiconductor integrated circuit that includes semiconductor amplification element parts, the bias circuits, capacity elements, etc. are integrated will be referred to as a high frequency power amplifier module or simply as a module.

And, a portable telephone system is generally configured so as to change the output (transmission power) according to the ambient conditions with use of a power level command signal received from a base station so as not to cause radio interference in the communications with another portable telephone. For example, in the case of the cellular portable telephone such as the 900 MHz band standard method employed in the United States of America, the GSM (Global System for Mobile Communication) method employed in Europe, etc., the high frequency power amplifier module in the transmission side output stage is configured so that the gate bias voltage of each output power element is controlled so as to output a power required for talking with use of the output voltage Vapc of the APC (Automatic Power Control) circuit.

In addition, for a portable telephone, employment of a high efficiency high frequency power amplifier module is a very important factor for deciding a talking time and a waiting time, that is, an operating life of the battery. This is why the performance of the mutual conductance, etc. among the semiconductor amplification elements of a module has been improved to achieve such the high efficiency.

Japanese Patent Application No. Hei 11(1999)-275465 discloses a radio communication apparatus in which a multistage high frequency power amplifier module is built. The module includes a plurality of MOSFETs that are connected in a cascade. This radio communication apparatus improves the controllability of the output power Pout (to suppress an increase of the Pout with respect to an increase of the Vapc, that is, $\Delta Pout/\Delta Vapc$) with use of bias means provided to generate a gate bias voltage Vg so as to minimize the variation of the output power Pout with respect to the Vapc around the threshold voltage Vth of the MOSFET in each amplification stage according to the power control signal voltage Vapc generated on the basis of its body power control signal.

SUMMARY OF THE INVENTION

FIG. 23 shows a bias circuit that controls the gate bias voltage in each stage in the three-stage high frequency power amplifier module disclosed in the above official gazette non-linearly with respect to the power control signal voltage Vapc. As shown in FIG. 23, the bias means (bias circuit) of the three-stage high frequency power amplifier module is composed of a plurality of resistors R01 to R04 connected serially and a transistor Q01 connected to those resistors R01 to R04 through a diode respectively. The resistor's voltage dividing ratio is set so as to obtain the maximum power at a position where the Vapc becomes as large as about 2 V, thereby the gate bias in each stage is decided. The diode-connected transistor is usually transformed into an MMIC (Microwave Monolithic IC) with use of the same semiconductor process technology as that of the amplification MOSFET.

FIGS. 24 and 25 are graphs for denoting a relationship between the power control signal voltage Vapc in the bias means shown in FIG. 23 and the gate bias voltage Vg in each stage and a relationship between the power control signal voltage Vapc obtained by the present inventor through a test of a module composed as shown in FIG. 23 and the output voltage Pout. The amplification MOSFETs used in the above test have a threshold voltage Vth of about 0.8 V respectively.

In the bias circuit disclosed in the above gazette, the gate bias voltage Vg in each stage is varied linearly (Vg=Vapc), since the control voltage Vapc is output as Vg1 to Vg3 with no change. This is because the Q01 is off until the control voltage Vapc reaches the threshold voltage of the diode-connected transistor Q01 as to be understood from the graph shown in FIG. 24 that shows a relationship between the control voltage Vapc of this circuit and the gate bias voltage Vg in each stage. The gate bias voltage Vg is then varied non-linearly.

In the module shown in FIG. 23, however, the threshold voltage Vth of the amplification MOSFET becomes almost the same as the threshold voltage of the diode-connected transistor formed in the same process, so that the amplification MOSFETs in all the stages are driven almost concurrently, thereby the output power Pout changes suddenly. In other words, as to be understood from the graph shown in FIG. 25, the output power curve that denotes the characteristics of the output power is inclined sharply around 0 dBm and the output power Pout changes significantly due to a slight change of the voltage Vapc. This is why the controllability of the output power has not been improved to the required level. In addition, the output power Pout also comes to change more sharply depending on a variation of the threshold voltage Vth of the amplification MOSFETs.

In prior to the present invention, the inventor has examined a bias circuit composed of a plurality of resistors R01 to R04 connected serially as shown in FIG. 20. The bias circuit is used to linearly control the gate bias voltage in each stage in the three-stage high frequency power amplifier module with respect to the power control signal voltage Vapc. FIGS. 21 and 22 are graphs for denoting a relationship between the power control signal voltage Vapc and the gate bias voltage Vg in each stage in the bias circuit shown in FIG. 20 and a relationship between the power control signal voltage Vapc obtained by the inventor through a test of the module composed as shown in FIG. 20 and the output power Pout. The threshold voltage Vth of the amplification MOSFETs used in the above test is about 0.8 V.

As shown in FIG. 20, a resistance ladder circuit is generally used as a bias circuit for linearly controlling an object voltage. The voltage dividing ratio of the resistor decides an inclination of the gate bias voltage Vg. As to be understood from the graph shown in FIG. 22, the curve that denotes the characteristics of the output power inclines sharply around an output power of 0 dBm. The output power Pout changes significantly at a slight change of the voltage Vapc even when the bias circuit as shown in FIG. 20 is used. This means that the output controllability is not so good.

Under such circumstances, it is an object of the present invention to provide a high frequency power amplifier circuit device that can obtain excellent controllability of an output power with use of a power control signal voltage.

It is another object of the present invention to provide a high frequency power amplifier circuit device that can obtain excellent controllability of an output power with use of a power control signal voltage, as well as a high efficiency at a low output power.

It is still another object of the present invention to provide a high frequency power amplifier circuit device that enables radio communication apparatuses to obtain a longer talking time and a longer operating time of its battery respectively.

These and other objects, features of novelties of the present invention will become more apparent by referring to the following description and appended drawings.

Next, the typical items of the present invention disclosed in this specification will be described briefly.

In a high frequency power amplifier circuit device provided with multiple output stages in which a plurality of first semiconductor amplification elements (Q1 to Q3) are connected in a cascade and a bias control circuit (10) that drives each of the plurality of first semiconductor amplification elements according to a control voltage, the bias control circuit is configured so as to apply a predetermined initial bias voltage to the control terminal of each of the plurality of first semiconductor amplification elements, thereby supplying a current to each of the semiconductor amplification elements even when an input control voltage is practically "0" and the initial bias voltage applied to the plurality of first semiconductor amplifier elements is controlled so as to become higher gradually from the first stage to the last stage.

According to the above described means, for example, in a radio communication apparatus, the sharp change of the output power caused by the control voltage is eased, thereby the controllability of the output power is improved, since the change rate of the bias voltage in each of the first semiconductor amplifier elements can be reduced in an area where the control voltage is low, especially in an area around the threshold voltage where the gain change in each of the first semiconductor amplification elements is significant when the bias of the first semiconductor amplification element in each stage is controlled according to a control voltage (power control signal voltage Vapc) output from an automatic power control circuit (APC circuit) via a bias control circuit according to a power level command signal.

Furthermore, the above described means enables the bias conditions (bias starting point and bias voltage change rate) of the first semiconductor amplification element in each stage to be set at a desired valance and the first semiconductor amplification element in the last stage to be driven very efficiently, so that the operating current of the high frequency power amplifier circuit device is reduced and the talking time and the working life of the battery in the subject portable telephone are extended.

The change rate of the bias voltage to be applied to the control terminal of each of the plurality of output semiconductor amplification elements should preferably be set lower gradually from the first stage to the last stage while the first voltage is higher than the threshold voltage of the semiconductor amplification elements and higher gradually from the first stage to the last stage when the first voltage is exceeded. Consequently, it is possible to improve the efficiency of the high frequency power amplifier circuit device of the present invention when the control voltage is low and drive the circuit device so as to obtain a high output power when the control voltage is high. The first voltage mentioned above should preferably be 0.1 to 0.5 V higher than the threshold voltage of the first semiconductor amplification elements.

The change rate of the bias voltage applied to the control terminal of each of the plurality of first semiconductor amplification elements is controlled so as to become higher when the control voltage is higher than the second voltage, which is higher than the first voltage. Consequently, the circuit device can be driven so as to obtain a desired output power more efficiently.

The bias control circuit controls the bias voltage applied to each of the first semiconductor amplification elements to "0" practically until an input control voltage reaches a third voltage, which is lower than the first voltage, then applies a predetermined initial bias voltage to each of the first semiconductor amplification elements when the control voltage reaches the third voltage. Consequently, it is possible to turn off the high frequency power amplifier circuit device to minimize the output power (leak power, isolation) when the control voltage is almost "0". In addition, it is possible to generate a dead band that can reduce the current (leak current) that flows in the high frequency power amplification circuit device when the control voltage is 0 V.

The bias control circuit includes a current buffer circuit being composed of a voltage-current conversion circuit (11) that converts the control voltage to a current; a first resistor (R12) that converts the current supplied from the voltage-current conversion circuit to a voltage; a control voltage generation circuit (12) that includes a first constant current source (Ic) and a second semiconductor amplification element (Q12) connected serially to the first constant current source and enabled to generate a voltage equivalent to a threshold voltage of the second semiconductor amplification elements; a third semiconductor amplification element (Q16) that generates a current according to a synthesized voltage of the voltage generated by the control voltage generation circuit and the voltage converted by the first resistor; and a second constant current source (Ir) connected to the control terminal of the third semiconductor amplification element and enabled to pull in a current supplied from the voltage-current conversion circuit; a current buffer circuit (13) that supplies a current having the same characteristics as those of the current flowing in the third semiconductor amplification element; current-voltage conversion means (R13) that converts a current flowing in the current buffer circuit to a voltage to drive the first semiconductor amplification elements. The current of the second constant current source is varied among the first semiconductor amplification elements, thereby the control voltage level on which a current begins flowing in each of the first semiconductor amplification elements is varied among the first semiconductor amplification elements. Consequently, because the bias voltage change rate of each of the first semiconductor amplification elements can be reduced in an area where the control voltage is low, especially in an area around the threshold voltage where the gain change rate of the semiconductor amplification elements is large, the controllability of the output power can be improved. In addition, the control voltage level on which a current begins flowing in each of the first semiconductor amplification elements can be varied only by changing the current value of the second constant current source (Ir). It is thus possible to obtain output characteristics in accordance with the target first semiconductor element.

Furthermore, the high frequency power amplifier circuit device includes a plurality of semiconductor amplifier elements (Q10, Q20, and Q30), each being connected to one of the plurality of first semiconductor amplification elements so as to form a current mirror circuit. The above described bias control circuit is composed of a voltage-current conversion circuit that converts the control voltage to a current; a first resistor that converts a current supplied from the voltage-current conversion circuit to a voltage; a control voltage generation circuit provided with a first constant current source and a second semiconductor amplification element connected serially to the first constant current source and enabled to generate a voltage equivalent to the threshold voltage of the second semiconductor amplification element; a third semiconductor amplification element that generates a current according to a synthesized voltage of the voltage generated by the control voltage generation circuit and the voltage converted by the first resistor, and a second constant current source connected to the control terminal of the third semiconductor amplification element and enabled to pull in a current supplied from the voltage-current conversion circuit. The bias control circuit supplies a current to each of the semiconductor amplification elements connected to one of the first semiconductor amplification elements to form a current mirror respectively to drive each of the first semiconductor amplification elements. The current has the same characteristics as those of the current flowing in the third semiconductor amplification element. And, the current supplied from the second constant current source is set so as to be different among the plurality of first semiconductor amplification elements, thereby a control voltage level on which the current begins flowing in each of the first semiconductor amplification elements comes to differ from others.

Consequently, it is possible to vary the control voltage level on which the current begins flowing in each of the first semiconductor amplification elements only by changing the current value of the second constant current source (Ir), thereby it is possible to obtain output characteristics easily in accordance with the target semiconductor element. In addition, because each of the first semiconductor amplification elements is driven by a current provided with predetermined characteristics, the high frequency power amplifier circuit device of the present invention can have output characteristics that are free of the variation of the characteristics of the threshold voltage, etc. of the first semiconductor amplifier elements.

The above described bias control circuit includes a plurality of first current sources (Q42, Q43, and Q44) that supply a current in proportion to the control voltage and a plurality of second current sources (Q46, Q49, and Q52), each supplying a current different from others regardless of the value of the control voltage. The bias control circuit synthesizes currents obtained by subtracting the current of the corresponding second current source from each of the plurality of first current sources to generate a control current (Ia1) and drive each of the first semiconductor amplification elements with a voltage converted from the control current or with a current whose characteristics are the same as those of the control current, thereby the change rate of the bias voltage is changed according to the control voltage. The bias control circuit can thus vary the control voltage level on which a current begins flowing in each of the semiconductor amplification elements even in such a configuration.

The bias control circuit includes a plurality of differential amplifier circuits (GM-AMP1 to GM-AMP4), each receiving a common control voltage via one input terminal thereof and first and second voltages via another input terminal as compare voltages, as well as a plurality of current circuits (Q31 to Q38), each supplying a current according to the output of each of the plurality of differential amplifier circuits. The plurality of first semiconductor amplification elements are driven with a voltage converted from a current generated by synthesizing the currents supplied from the plurality of current circuits or driven with a current having practically the same characteristics as those of the synthesized current, thereby the bias change rate is changed in accordance with the control voltage. Even in such a configuration, the bias control circuit of the present invention can vary the control voltage level on which the current begins flowing in each of the semiconductor amplification elements among the semiconductor amplification elements.

The voltage-current conversion circuit includes a differential amplification circuit (114) that receives the control voltage (Vapc) via one input terminal thereof and a comparison circuit (113) that detects whether or not the control voltage has reached the predetermined voltage and a switch element (Q26) is provided in parallel to a load element of the differential amplification circuit and the switch element is turned on/off by an output of the comparison circuit, thereby no current is flown to any of the first semiconductor amplification elements until the control voltage reaches a predetermined voltage and the predetermined initial bias voltage is applied to the first semiconductor amplification elements so as to flow a current in each of them after the control voltage reaches the predetermined voltage. Consequently, when the control voltage is almost "0", the high frequency power amplifier circuit device can be turned off to minimize the output power. In addition, it is possible to easily realize a circuit that generates a dead band that reduces the leak current flowing in the high frequency power amplifier circuit device when the control voltage is 0 V.

DETAILED DESCRIPTION OF THE PREFERRED EMBODIMENTS

Hereunder, the preferred embodiments of the present invention will be described in detail with reference to the accompanying drawings. In all the drawings for describing the embodiments of the present invention, the same numerals will be given to the same function items, avoiding redundant description.

Although field effect transistors (FET) are used as the semiconductor amplification elements in the following embodiments, the semiconductor amplification elements are not limited only to the FET; they may be any of bipolar transistors, heterojunction bipolar transistors (HBT), high-electron-mobility transistors (HEMT), etc. The semiconductor substrate on which the semiconductor amplification elements are formed is not limited only to a silicon substrate; it may be any of a silicon-germanium substrate, a gallium arsenide substrate, etc.

Figure 1:
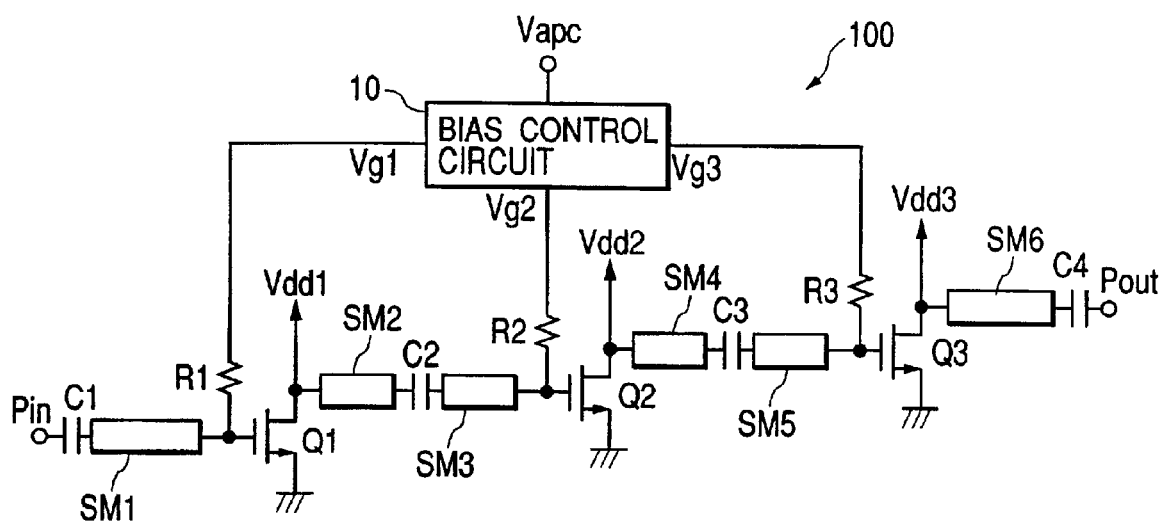
FIG. 1 is a circuit diagram of a high frequency power amplifier module in the first embodiment of the present invention.

FIG. 1 shows a circuit diagram of a high frequency power amplifier circuit device (high frequency power amplifier module) in which FETs are connected in a cascade of three stages in the first embodiment of the present invention.

The high frequency power amplifier module 100 in the first embodiment is composed of a plurality of FETs (hereinafter, to be referred to simply as transistor(s) sometimes) used as active elements connected sequentially in a cascade in multiple stages like a circuit. Concretely, the gate terminal of the transistor Q2 in the middle stage is connected to the drain terminal of the transistor Q1 in the initial stage and the gate terminal of the transistor Q3 in the last stage is connected to the drain terminal of the transistor Q2 in the middle stage. The transistors are disposed in three stages such way.

The high frequency power amplifier module 100 in this first embodiment is effectively employable for a portable telephone used as a radio communication apparatus. Although not limited specially, the transistor Q3 in the last stage is composed of discrete parts (output power MOSFET, etc.) in this first embodiment while the transistors Q2 and Q3 in the initial and middle stages, as well as a bias control circuit 10 are assembled into a semiconductor integrated circuit formed on one semiconductor chip. Capacitors C1 to C4 are connected to the semiconductor integrated circuit as external elements.

In the high frequency power amplifier module 100 in this first embodiment, a high frequency signal Pin is inputted to the gate of the transistor Q1 in the initial stage via the capacitor C1. The drain of the transistor Q3 in the last stage is connected to the output terminal Pout via the capacitor C4, thereby the DC component of a high frequency signal RFin is eliminated and the AC component of the signal RFin is amplified so as to be output. The bias control circuit 10 controls the output power at this time.

In FIG. 1, reference characters MS1 to MS6 denote micro-strip paths that work as inductance elements to assume the impedance coherence among the stages. These paths are formed by, for example, conductive layer patterns formed so as to assume a predetermined inductance value on a ceramic substrate on which a semiconductor chip that includes the above described bias control circuit 10 is mounted. The conductive patterns are made of copper or the like. The capacitors C1 to C4 connected serially to the micro-strip paths MS1 to MS6 work to shut off the DC supply voltages (Vdd1 to Vdd3) and the gate bias voltages (Vg1 to Vg3).

The bias control circuit 10 is provided with a control terminal to which a power control signal voltage Vapc is inputted and a terminal that outputs gate bias voltages (Vg1 to Vg3) of the output transistors Q1 to Q3. In a GSM type radio communication apparatus, the voltage Vapc is output from the automatic power control circuit. Resistors R1 to R3 provided between the output terminal of the bias control circuit 10 and the gate terminal of each of the output transistors Q1 to Q3 are used to prevent the high frequency signals from leaking to the bias control circuit 10.

The bias control circuit 10 in this first embodiment generates a bias voltage so as to satisfy the relationship between the power control signal voltage (Vapc) and the gate bias voltage in each stage (Vg1 to Vg3) when the threshold voltage of the output transistor Q1/Q2/Q3 (hereinafter, to be referred to as 1st FET/2nd FET/3rd FET sometimes) in each stage becomes, for example, 0.5 V.

Figure 2:
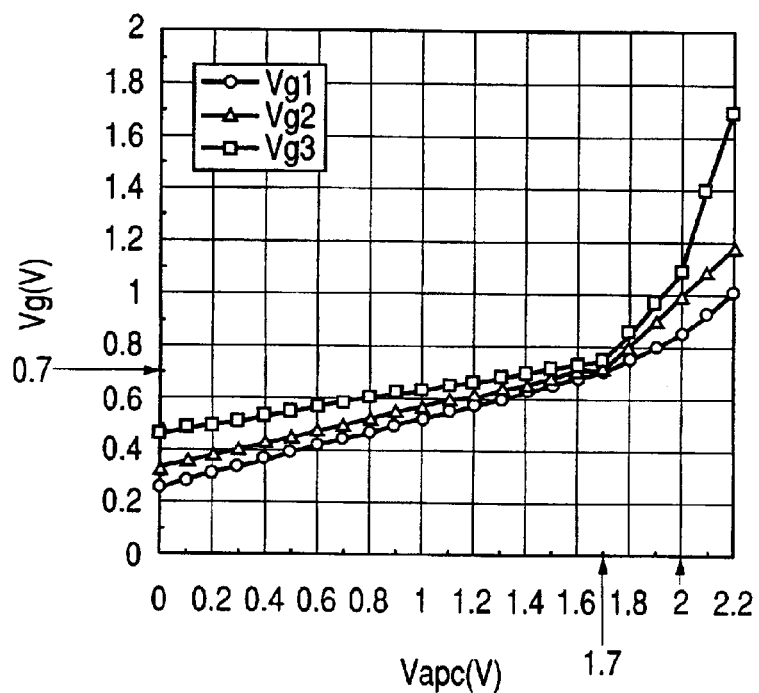
FIG. 2 is a graph for denoting a relationship between the power control signal voltage and the gate bias voltage in each stage in the high frequency power amplifier module in the first embodiment of the present invention.

Concretely, as shown in FIG. 2, the bias voltages are set so that the relationship of VB1<VB2<VB3 (ex., 0.27 V<0.34 V<0.47 V) is satisfied when the gate bias voltages Vg1 to Vg3 of the 1st to 3rd FETs, that is, when the initial values of the Vg1 to Vg3 are VB1 to VB3 while the power control signal voltage Vapc is 0 V. And, the change rates of the bias voltages of the first to third FETs (a rate of an increase of Vg to an increase of the Vapc) are set so as to satisfy the relationship of $\Delta Vg1/\Delta Vapc > \Delta Vg2/\Delta Vapc > \Delta Vg3/\Delta Vapc$ (ex., 0.26>0.22>0.16) until the Vapc reaches 1.7 V and satisfy the relationship of $\Delta Vg1/\Delta Vapc > \Delta Vg2/\Delta Vapc > \Delta Vg3/\Delta Vapc$ when the Vapc reaches 1.7 V or over and the change rates of the gate bias voltages Vg1 to Vg3 of the 1st to 3rd FETs are $\Delta Vg1/\Delta Vapc$, $\Delta Vg2/\Delta Vapc$, and $\Delta Vg3/\Delta Vapc$. In addition, even when the Vapc reaches 1.7 V or over, the change rates of those gate bias voltages are set so as to satisfy the relationship of $\Delta Vg1/\Delta Vapc$, $\Delta Vg2/\Delta Vapc$, and $\Delta Vg3/\Delta Vapc$, for example, the relationship of 0.49<0.88<1.16 until the Vapc reaches 2.0 V. When the Vapc reaches 2.0 V or over, each change rate further increases, for example, to satisfy the relationship of 0.82<0.96<2.99.

Furthermore, the gate bias voltages Vg1 to Vg3 of the 1st FET to 3rd FET are set so as to become about 45%, 55%, and 75% of the Vapc to obtain the maximum output power and drive the circuit device efficiently when the power control signal voltage Vapc is the maximum value 2.2 V. The efficiency is improved more when the gate bias voltage of the FET in the preceding stage is raised and the gain of the FET in the last stage is suppressed. In this first embodiment, although not limited specially, the power control signal voltage Vapc, when the order of the rage rates of the gate bias voltages Bg1 to Vg3 is reversed, is assumed to reach 1.7 V, which is a value corresponding to 0.7 V when the gate bias voltage Vg1 at which the gain change rate of the 1st FET decreases is about 0.2 V higher than the threshold voltage (0.5 V) and satisfies the relationship of Vg1<Vg2<Vg3.

Figure 19:
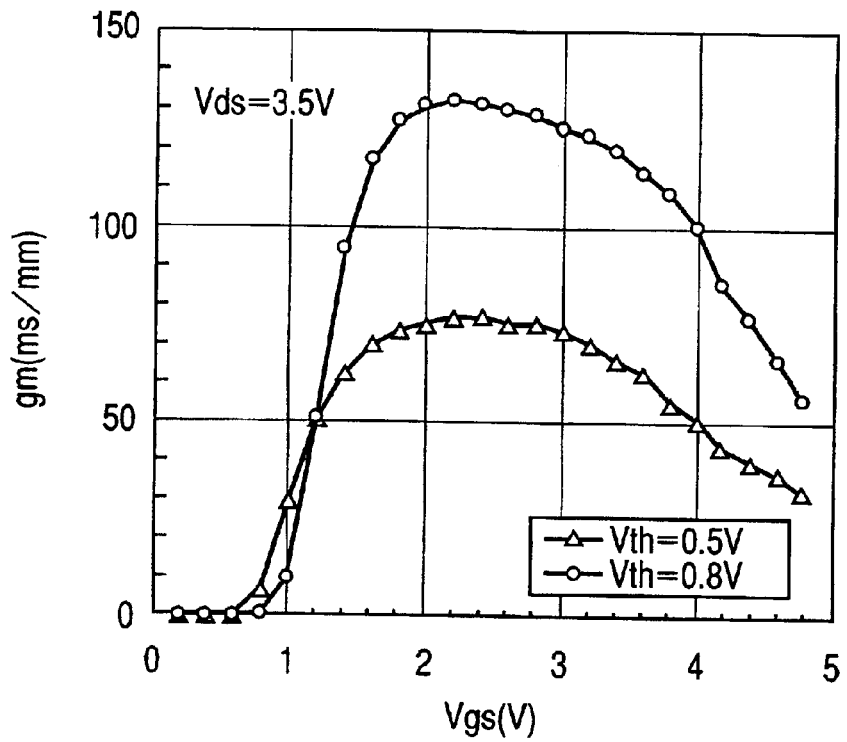
FIG. 19 is a graph for denoting a relationship between the gate voltage of each of MOSFETs whose threshold voltages are 0.5 V and 0.8 V, and the gm value (mutual conductance)

FIG. 19 shows a graph for denoting the characteristics of the relationship between the gate voltage Vgs of the MOS-FET and the mutual conductance gm per unit gate width. In the graph shown in FIG. 19, the threshold voltage Vth is defined with the gate voltage Vgs assumed when the drain current Ids per unit gate width becomes 0.1 mA. For example, the threshold voltage Vth, when the gate width Wg is 20 mm, takes the value of the Vgs that satisfies Ids=0.2 mA. In the MOSFET, the gate length Lg is micronized to improve the performance of the memory device. Generally, when the Lg is micronized, the Vth increases. FIG. 19 also shows a relationship between the MOSFET gate voltage Vgs and the mutual conductance gm per the unit gate width on a Vth=0.8 V chip. At this time, the Vth=0.8 V chip is obtained by micronizing a Vth=0.5 V chip, so that the maximum gm value is improved by about 1.7 times as shown in the graph in FIG. 19. In addition, it would be understood from the graph that the gm change rate of the Vth=0.5 V chip becomes the maximum around Vgs=1 V. This gm change rate affects the gain change of the high frequency power amplifier module significantly. Especially, the gm change rate at the leading portion where the Vgs becomes about 0.2 V higher than the Vth affects the gain change remarkably. In this first embodiment, therefore, the power control signal voltage Vapc with which the order of the change rates of the gate bias voltages Vg1 to Vg3 is set around 1.7 V.

Figure 20:
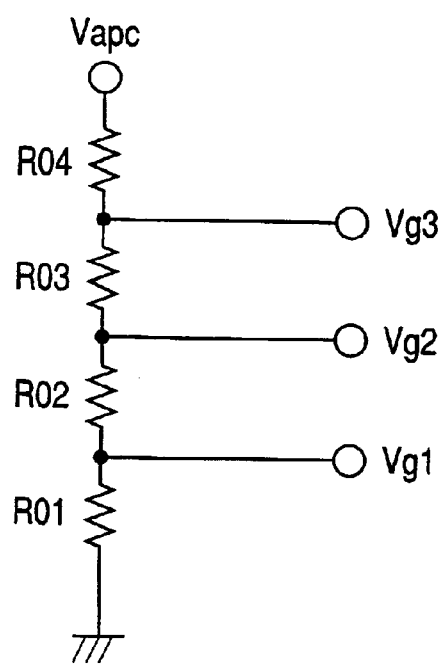
FIG. 20 is a circuit diagram of a bias circuit that controls the gate bias voltage in each state linearly with respect to a power control signal voltage in a three-stage high frequency power amplifier module examined in prior to the present invention.
Figure 21:
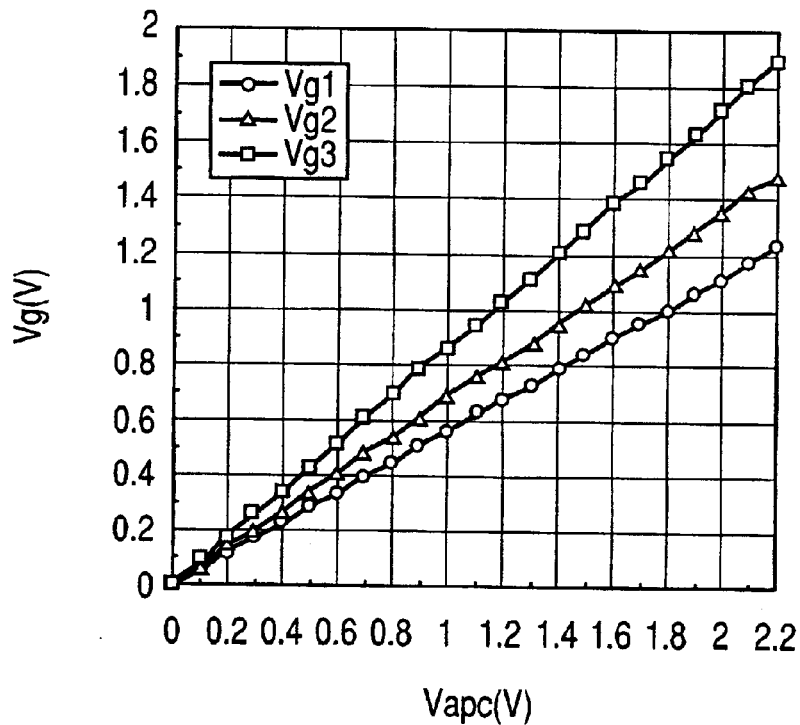
FIG. 21 is a graph for denoting a relationship between the power control signal voltage and the gate bias voltage in each stage with respect to the bias circuit shown in FIG. 20.
Figure 23:
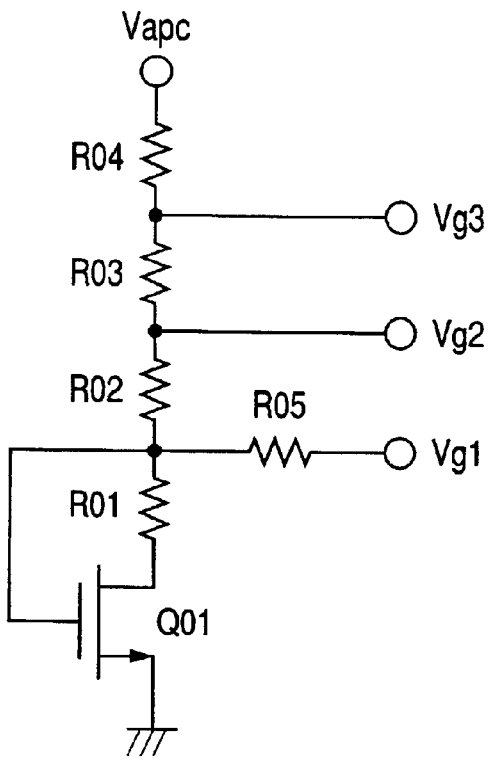
FIG. 23 is a circuit diagram of another bias circuit that controls the gate bias voltage in each state with respect to a power control signal voltage linearly in the three-stage high frequency power amplifier module examined in prior to the present invention.
Figure 24:
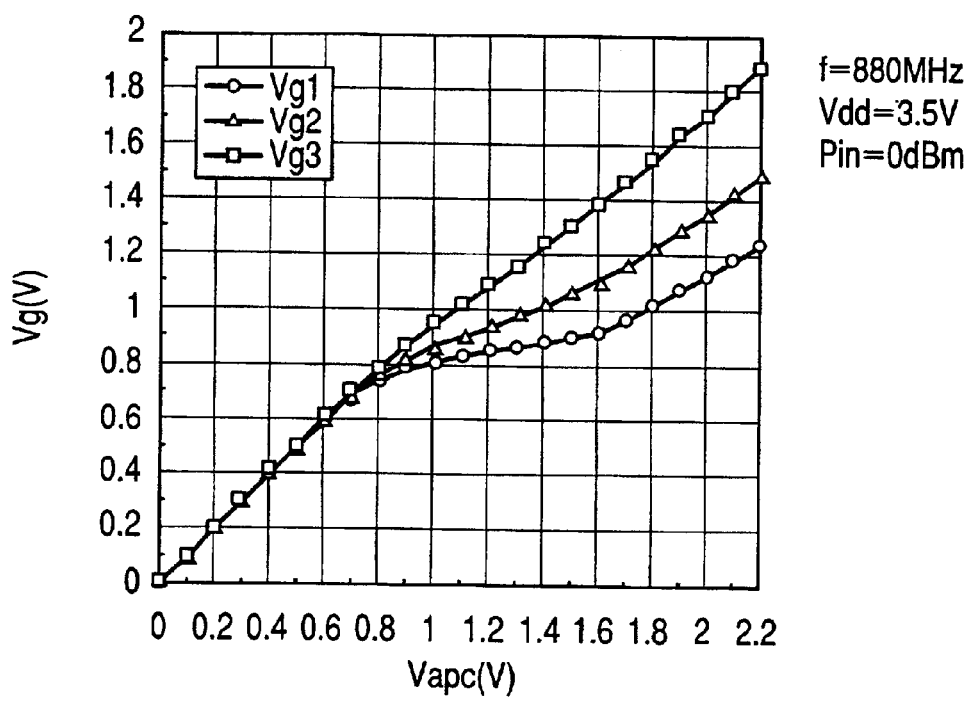
FIG. 24 is a graph for denoting a relationship between the power control signal voltage and the gate bias voltage in each stage with respect to the bias circuit shown in FIG. 23.

In the high frequency power amplifier module in this first embodiment shown in FIG. 2, the characteristics of the change of each gate bias voltage Vg1/Vg2/Vg3 of the 1st/2nd/3rd FET, which will become apparent in the comparison with that of the gate bias voltage Vg1/Vg2/Vg3 shown in FIGS. 21, 24, and 2 while the conventional bias circuit shown in FIGS. 20 and 23 is used, will become as follows. When the power control signal voltage Vapc is 0 V, the gate bias voltages Vg1 to Vg3 are 0 V and begin to be changed at "0" in the module that employs the conventional bias circuit. In this embodiment, however, the gate bias voltages Vg1 to Vg3 are about 0.3 V, 0.4 V, and 0.5 V when the power control signal voltage Vapc is 0 V and the initial value of each of those gate bias voltages has an offset.

Figure 3:
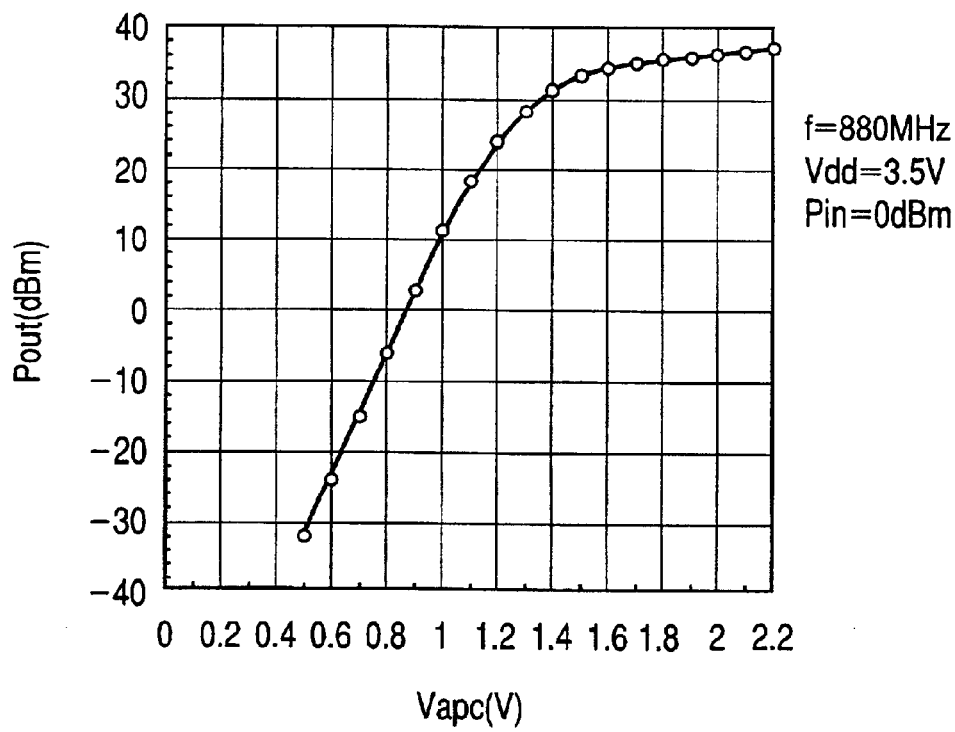
FIG. 3 is a graph for denoting a relationship between the power control signal voltage and the output power in the high frequency power amplifier module in the first embodiment of the present invention.
Figure 22:
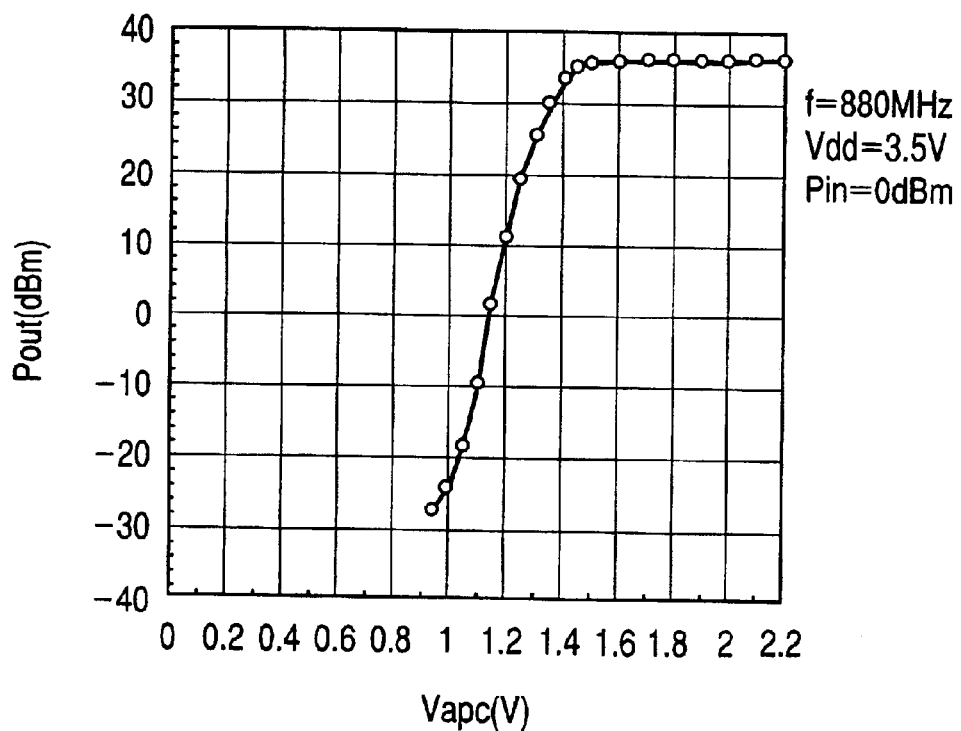
FIG. 22 shows a graph for denoting a relationship between the power control signal voltage and the output power in a three-stage high frequency power amplifier module in which the bias circuit shown in FIG. 20 is built.
Figure 25:
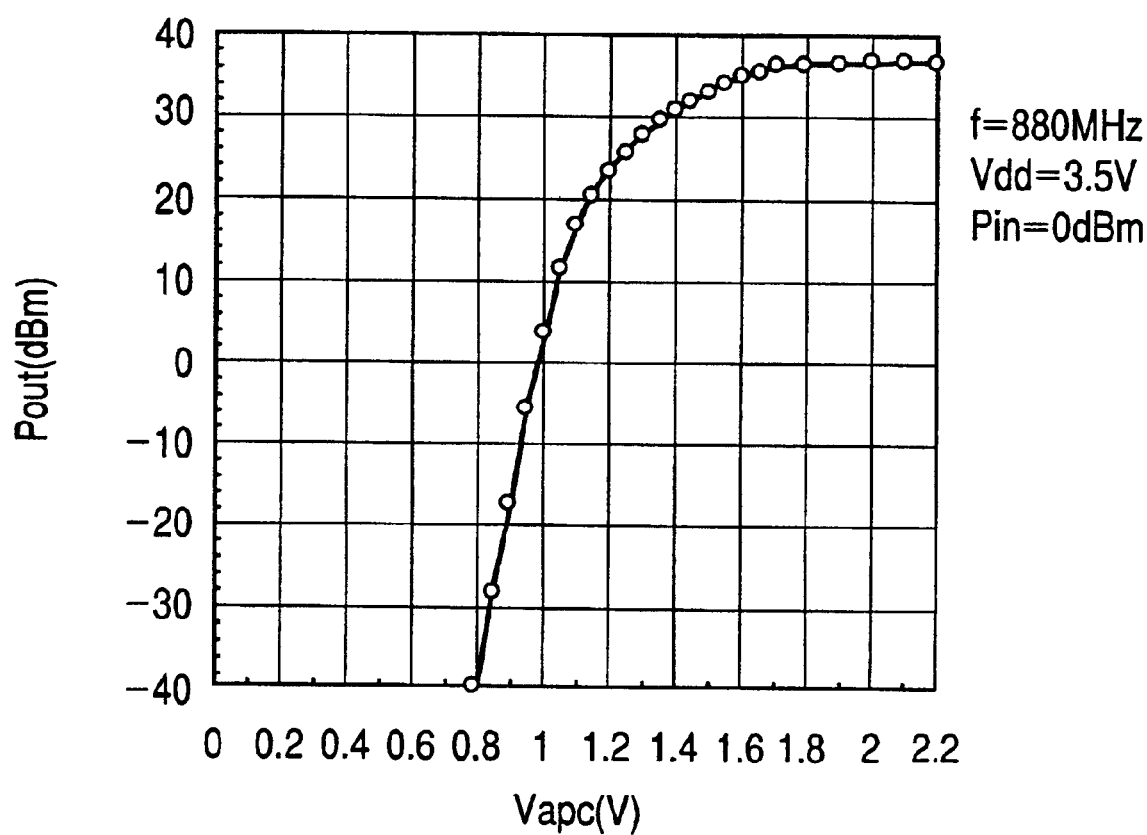
FIG. 25 is a graph for denoting a relationship between the power control signal voltage and the output power in a three-stage high frequency power amplifier module in which the bias circuit shown in FIG. 23 is built.

FIG. 3 shows a graph for denoting a relationship between the power control signal voltage Vapc and the output power Pout in the high frequency power amplifier module in this first embodiment. When compared with the graphs shown in FIGS. 22 and 25 that denote a relationship between the Vapc and the output power Pout in a module that employs the conventional bias circuit shown in FIGS. 20 and 23, the output power Pout in this embodiment reduces the inclination, that is, the change rate around 0 dBm and the power control signal voltage Vapc improves the controllability of the output power Pout.

Figure 4:
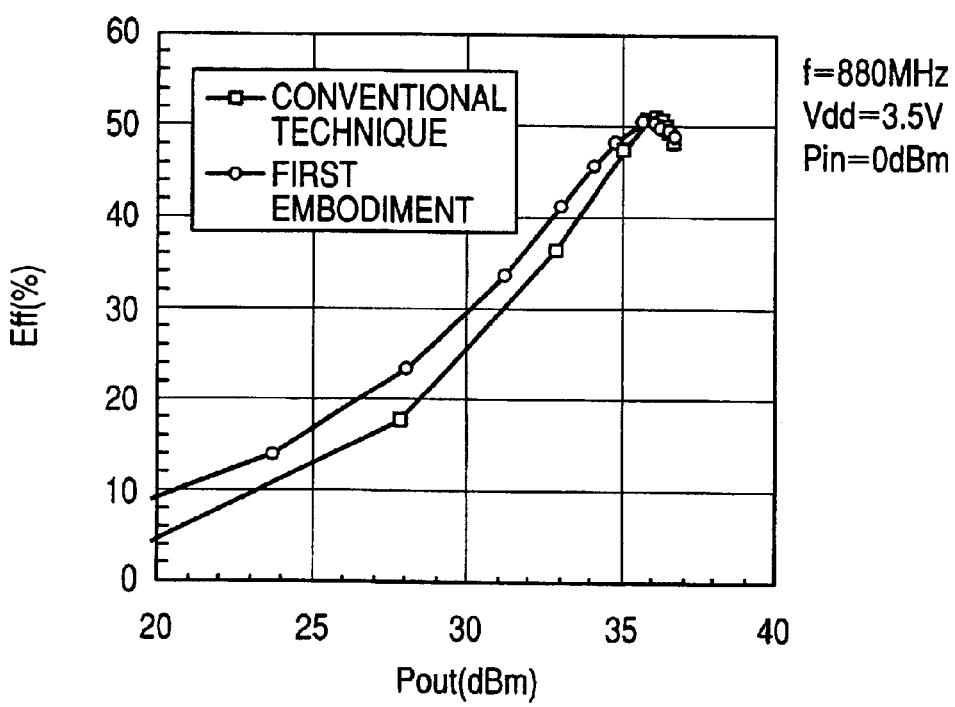
FIG. 4 is a graph for denoting a relationship between the output power and the efficiency in the high frequency power amplifier module in the first embodiment of the present invention.
Figure 5:
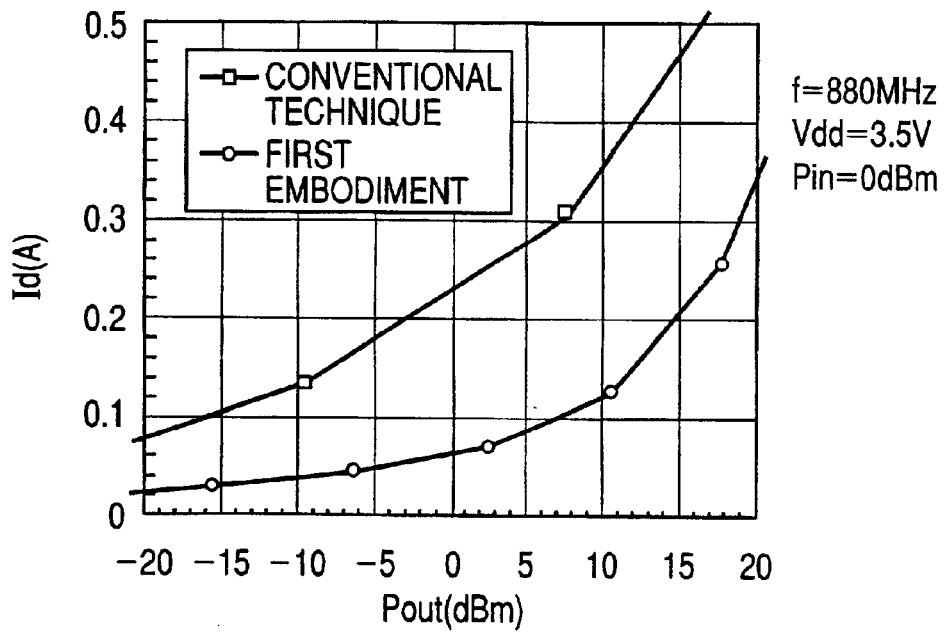
FIG. 5 is a graph for denoting a relationship between the output power and the operation current in the high frequency power amplifier module in the first embodiment of the present invention.

As shown in the graph in FIG. 4, the efficiency of the high frequency power amplifier module in this first embodiment is improved more than the module that employs the conventional circuit shown in FIGS. 20 and 23. The efficiency Eff, when the output power Pout is 30 dBm, is improved about 5% more than the conventional technique. The module efficiency Eff is defined as Eff=(Pout−Pin)/Vdd.Id when the total of the operating currents of the 1rst to 3rd FETs is Vdd. In addition, the operating current Id itself, as shown in the graph in FIG. 5, decreases significantly from that when the module employs the bias circuit shown in FIGS. 20 and 23. It would be understood that, when the output power Pout is 0 dBm, the operating current decreases to about ¼ of the conventional one.

Figure 6:
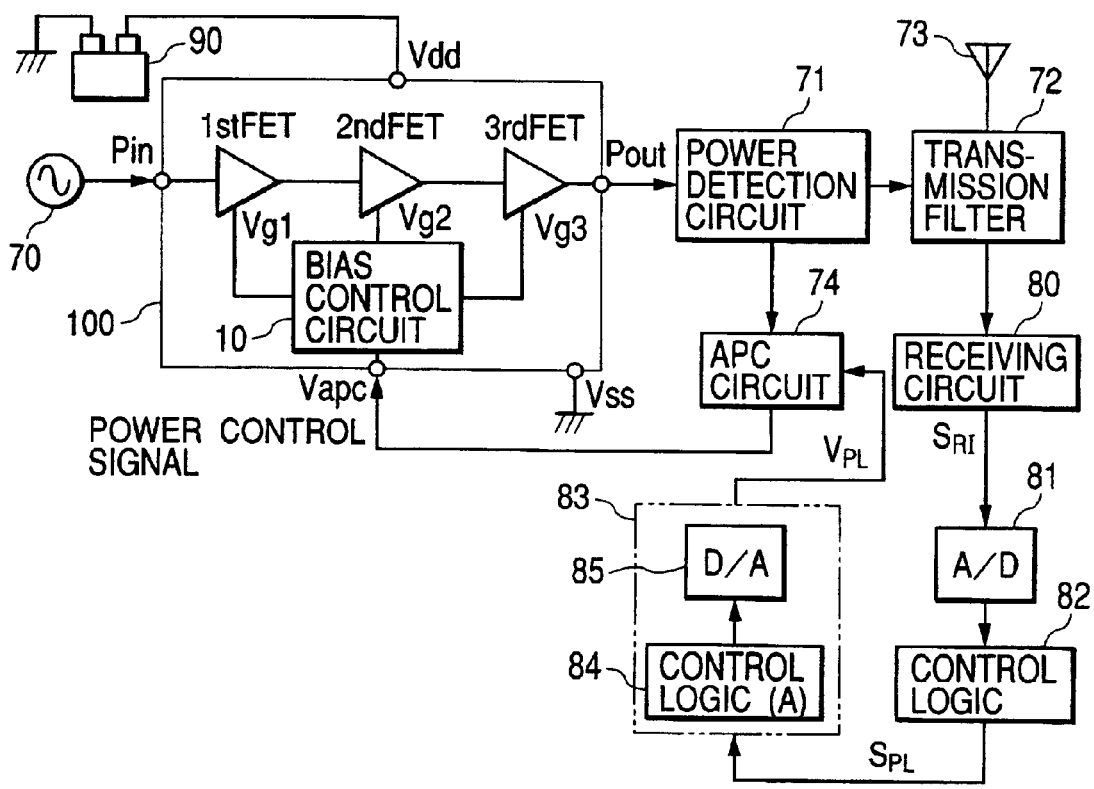
FIG. 6 is a partial circuit diagram of part of a radio communication apparatus in which the high frequency power amplifier module in the first embodiment is built.

FIG. 6 shows a block diagram of part of a radio communication apparatus (a portable telephone, a mobile phone, etc.) in which the high frequency power amplifier module shown in FIG. 1 is built.

The portable telephone, as shown in FIG. 6, receives an RF transmission signal generated by the oscillation of a modulation oscillator (VCO) 70 via an input terminal (pin) of the high frequency power amplifier module 1. The RF signal is amplified in the high frequency power amplifier module and output from an output terminal (Pout) to an antenna 73 via a power detection circuit 71 and a transmission filter 72, then transmitted therefrom.

On the other hand, the RF signal received by an antenna 73 is processed by a receiving circuit 80. A receiving strength signal $S_{RI}$ is output from the receiving circuit 80 and converted to a digital signal by an A/D converter 81, then supplied to a control logic 82. The control logic 82 outputs a power level command signal $S_{PL}$, which is then supplied to a logic 84 of an output level control circuit 83. This logic 84 processes the received power level command signal $S_{PL}$ to generate a control code, which is then converted to an analog signal by a D/A converter 85 and supplied to an automatic power control (APC) circuit 74 as a power level command voltage $V_{PL}$. The $A_{PC}$ circuit 74 then generates a power control signal Vapc according to the power level command voltage $V_{PL}$ and supplies the signal Vapc to the high frequency power amplifier module 100. The high frequency power amplifier module 100 drives an output transistor according to this signal. Reference numeral 90 denotes a battery that supplies a supply voltage Vdd to the high frequency power amplifier module 100.

As described above, in a portable telephone that uses the high frequency power amplifier module shown in FIG. 1, the bias control circuit 10 controls the gate voltages of the output transistors Q1 to Q3 according to the power control signal voltage Vapc output from the automatic power control circuit (APC circuit) according to the power level command signal $V_{PL}$. At this time, while the power control signal voltage Vapc is low, a small value is set for the change rate $\Delta Vg/\Delta Vapc$ of each gate bias voltage Vg and when the gain change of each output transistor decreases, a large value is set for the $\Delta Vg/\Delta Vapc$. Consequently, it is prevented that the output power Pout changes significantly according to a slight change of the power control signal voltage Vapc around the FET threshold voltage, thereby the controllability of the output power Pout is improved.

And, because the gate bias voltages Vg1 to Vg3 of the output transistors Q1 to Q3 are set so as to satisfy the relationship shown in FIG. 2, the output transistor Q3 in the last stage can be driven very efficiently, thereby the portable telephone at a low power output can be improved and the current consumption is reduced. The talking time and the operating life of the battery in the portable telephone can thus be more extended.

Figure 7:
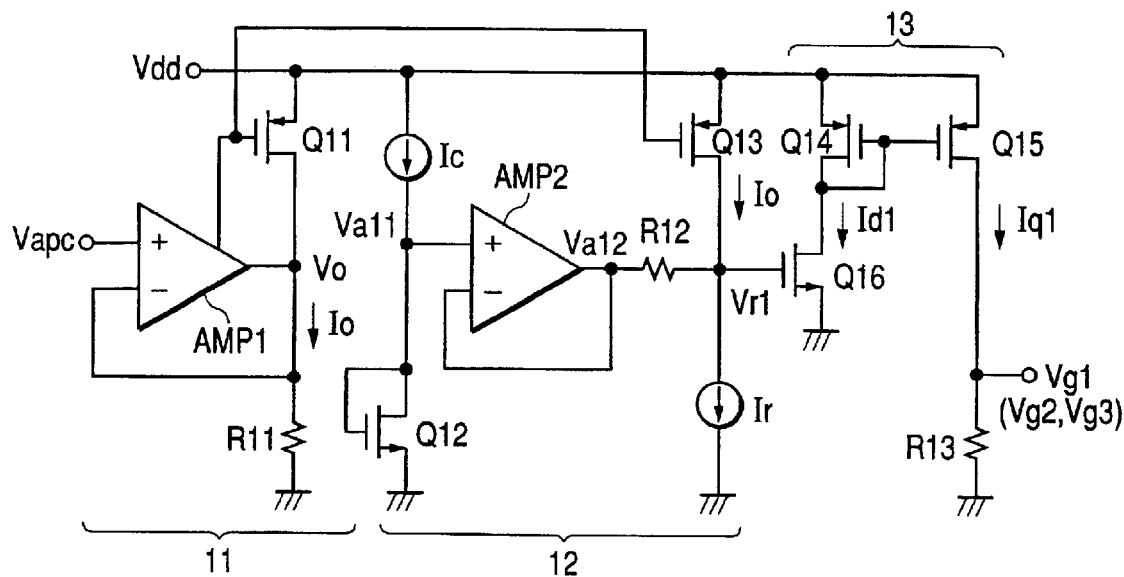
FIG. 7 is a circuit diagram of a concrete example of a bias control circuit in the high frequency power amplifier module in the first embodiment of the present invention.

FIG. 7 shows a concrete example of the bias control circuit 10 employed in the high frequency power amplifier module in this first embodiment. FIG. 7 shows part of the bias control circuit 10 in which the gate bias voltage Vg1 is generated for the output transistor Q1, which is one of the output transistors Q1 to Q3 in three stages. The gate bias voltages Vg2 and Vg3 of other output transistors Q2 and Q3 are also generated by circuits composed similarly.

The bias control circuit 10 shown in FIG. 7 is composed of a V/I conversion circuit 11 that includes an operational amplifier AMP1 for receiving a power control signal voltage Vapc from the APC circuit via its non-inversion input terminal, a field effect transistor Q11 that receives a voltage output from the negative side of the operational amplifier AMP1 via its gate terminal, and a resistor R11 connected serially to the transistor Q11; a current (square) conversion circuit 12 composed of a constant power source Ic, a field effect transistor Q12 connected serially to the constant power source Ic and enabled to function as a diode, an operational amplifier AMP2 that receives the drain voltage of the transistor Q12 via its non-inversion input terminal and enabled to function as a voltage follower, a field effect transistor Q13 that receives a voltage output from the negative side of the operational amplifier AMP1 via its gate terminal, a constant power source Ir connected serially to the transistor Q13, and a resistor R12 connected to between the output terminal of the operational amplifier AMP2 and the drain terminal of the transistor Q13; a current buffer circuit 13 composed of a voltage-current conversion transistor Q16 having a gate terminal connected to the connection node between the resistor R12 and the transistor Q13, a transistor Q14 connected serially to the transistor Q16, and a transistor Q15 having a gate connected to the gate of the transistor Q14; and a resistor R13 connected serially to the transistor Q15 and enabled to convert a current to a voltage. The transistors Q11 and Q13, as well as the transistors Q14 and Q15 are paired to form a current mirror respectively.

Next, the operation of the bias control circuit shown in FIG. 7 will be described.

Figure 8A:
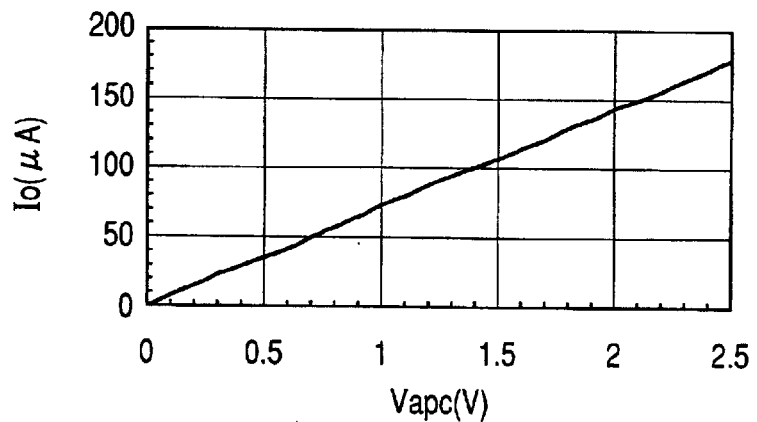
FIGS. 8A and 8B are graphs for denoting the characteristics of the operation of the bias control circuit shown in FIG. 7.

In the bias control circuit 10 shown in FIG. 7, the V/I conversion circuit 11 supplies a current Io to the transistors Q11 and Q13. The current Io is proportional to the power control signal voltage Vapc as shown in FIG. 8A. The transistor Q12 of the current (square) conversion circuit 12, since it has a gate and a drain connected to each other (diode-connected), outputs a voltage Va11 equivalent to its threshold voltage Vgs1 to the amplifier AMP2 from the drain terminal and the AMP2 outputs a voltage Va12 whose level is the same as that of the input voltage, that is, the threshold voltage Vgs1 of the transistor Q12.

It is assumed here that the constant current source Ir is omitted. Then, the current Io from the transistor Q13 is flown into the amplifier from the output terminal of the amplifier AMP2 via the resistor R12. Consequently, the gate voltage Vr1 of the transistor Q16 becomes a voltage (Vgs1+R12.Io), which is the value of R12.Io higher than the output voltage of the amplifier AMP2, that is, the threshold voltage Vgs1 of the MOSFET Q12.

Figure 8B:
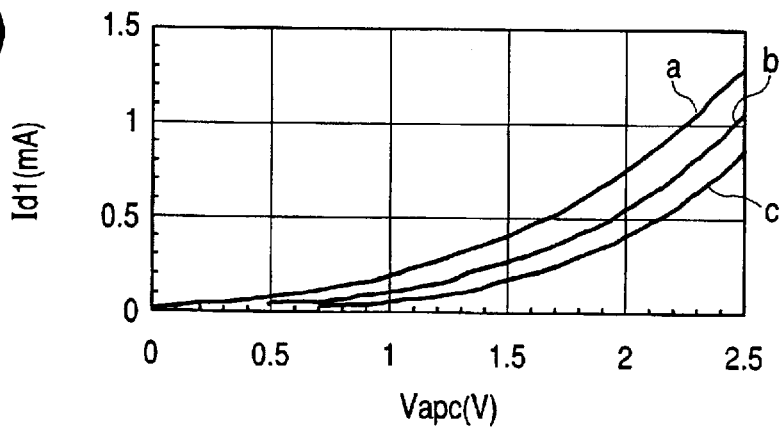

In the above expression, the current Io is proportional to the control voltage Vapc. Consequently, the gate voltage Vr1 of the transistor Q16 comes to change almost linearly in proportion to the control voltage Vapc. At this time, the drain current of an ordinary FET changes in proportion to the square of the gate voltage, so that the drain current Id1 of the transistor Q16 comes to change as shown by the curve "a" in FIG. 8B. In this first embodiment, because the above transistors Q12 and Q16 are formed on one semiconductor chip, the variation of the threshold voltage is identical between the transistors Q12 and Q16. In other words, when the threshold voltage of the Q12 rises, the threshold voltage of the Q16 also rises similarly. When the threshold voltage of the Q16 falls, the threshold voltage of the Q12 also falls similarly.

As a result, the current Id1 flowing in the transistor Q16 comes to change due to certain characteristics regardless of the variation of the threshold voltage. This current Id1 flows into the resistor R13 via a current mirror circuit composed of the transistors Q14 and Q15 so as to be converted to a voltage, then applied to the gate terminal of the output transistor Q1 (or Q2/Q3). Consequently, a current having the same characteristics as those of the Q12 drain current flows into the output transistor Q1 (or Q2/Q3). In other words, it is possible to obtain output characteristics can be free of influences from processes and temperature changes even when the threshold voltage of the output transistor Q1 (or Q2/Q3) is deviated from a predetermined value due to a process variation and/or temperature change.

When consideration is taken for the current flowing in the constant current source Ir, however, this current reduces the current flowing in the amplifier AMP2 from the transistor Q13 via the resistor R12. The gate voltage Vr1 of the transistor Q16 thus becomes Vgs1+R12.Io−R12.Ir. In other words, the gate voltage Vr1 of the transistor Q16, when the constant current source Ir exists, becomes the value of R12.Ir lower than the gate voltage of the transistor Q16 when the constant current source Ir does not exist. The current Id1 of the Q16 thus begins to change proportionally to the square of the control voltage Vapc when the Io matches with the Ir. This is why this constant current Ir is varied among the output transistors Q1 to Q3, thereby the starting point of the change of the drain current Id1 is shifted as shown by the characters a, b, and c in FIG. 8B. The initial value of the gate bias voltage Vg is thus offset as shown in FIG. 2 and the value of the constant current Ir can be set properly to reverse the order of the change rates of the Vg around Vapc=1.7 V.

The bias control circuit 10 shown in FIG. 7 is enabled to freely select a value of the resistor R12, a current value of the constant current source Ir, and a proper ratio between the FETs Q14 and Q15 of a current mirror circuit to adjust the initial values and change rates of the gate bias voltages Vg1 to Vg3. In the first embodiment, the characteristics of the change of the hate bias voltage Vg as shown in FIG. 2 at 1.7 V Vapc or over is decided by the characteristics of the gate voltage—drain current of the MOSFET. However, the present invention is not limited only to this embodiment; any methods to be described in the following embodiments may be used to realize similar characteristics.

Figure 9:
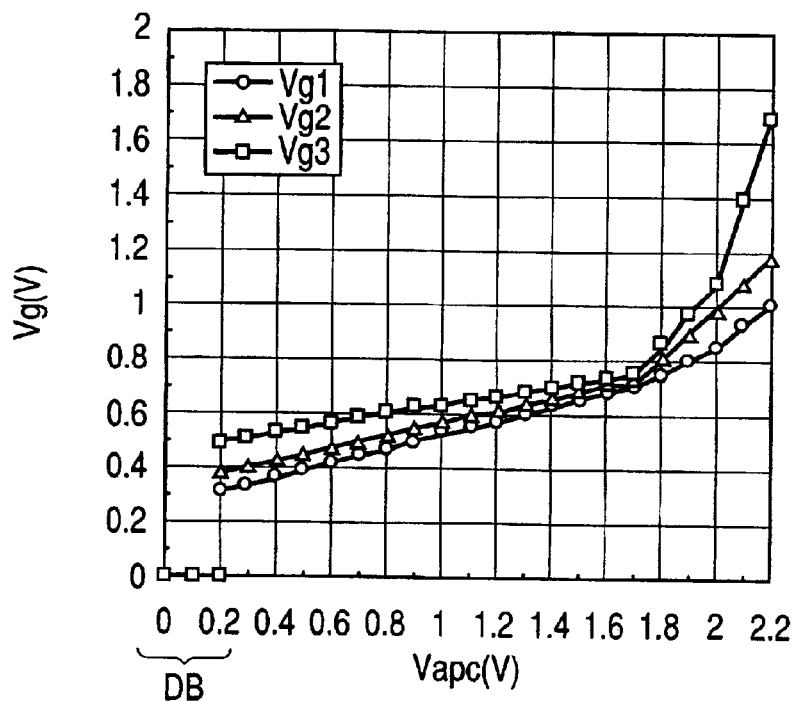
FIG. 9 is a graph for denoting a relationship between the power control signal voltage and the gate bias voltage in each stage in a high frequency power amplifier module in the second embodiment of the present invention.

FIG. 9 shows a graph for denoting a relationship between the power control signal voltage Vapc and the gate bias voltage in each stage Vg1/Vg2/Vg3 in the high frequency power amplifier module in the second embodiment of the present invention. Unlike the high frequency power amplifier module in the second embodiment of the present invention, a dead band (controlling inhibited area) DB is provided in this third embodiment as to be understood apparently in a comparison with the graph shown in FIG. 2. In this dead band (DB), the gate bias voltage Vg1/Vg2/Vg3 in each stage becomes 0 V when the power control signal voltage Vapc is 0.2 V or under. This dead band (DB) is used effectively to turn off the high frequency power amplifier module to minimize the output power (leak power, isolation) when the power control signal voltage Vapc is 0.2 V or under. In addition, when power control signal voltage Vapc is 0 V, the dead band (DB) can also reduce the current (leak current) flowing in the high frequency power amplifier module.

Figure 10:
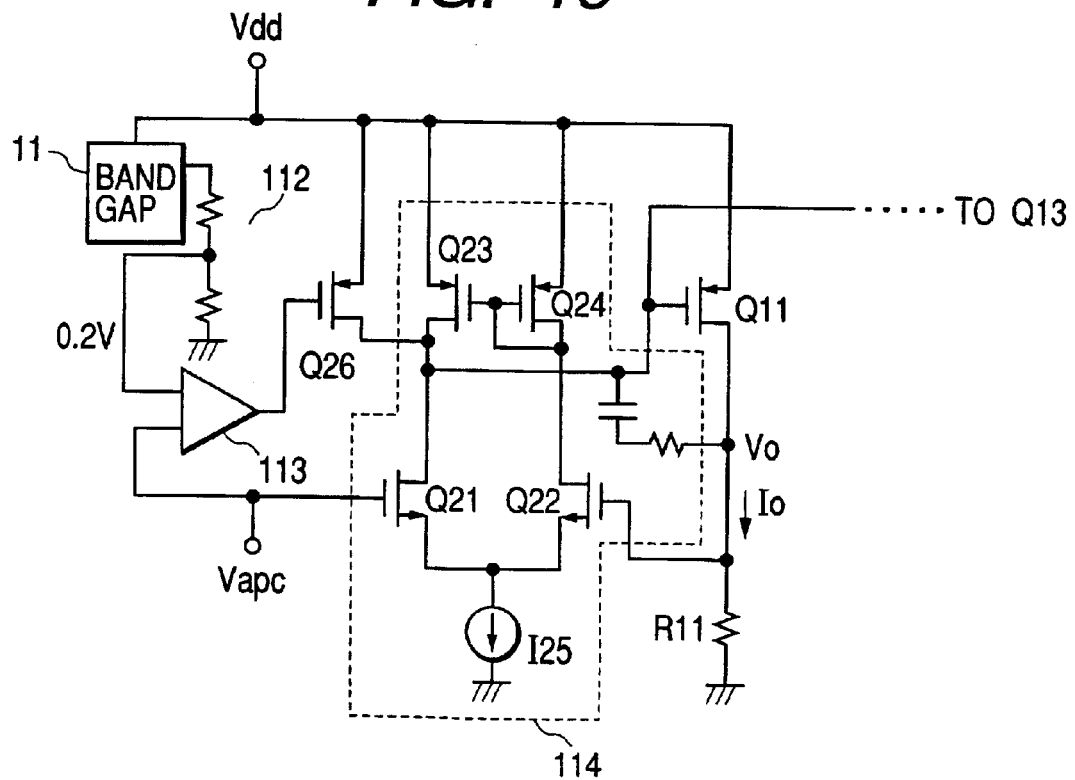
FIG. 10 is a circuit diagram of a concrete example of the major part of a bias control circuit in the high frequency power amplifier module in the second embodiment of the present invention.

FIG. 10 shows the major part of a bias control circuit that generates the gate bias voltages Vg1 to Vg3 described above so as to have the dead band (DB) as shown in FIG. 9. The circuit shown in FIG. 10, when it is used instead of the voltage-current conversion circuit 11 in the bias control circuit 10 shown in FIG. 7, can generate the gate bias voltages Vg1 to Vg3 having the dead band (DB) as shown in FIG. 9 respectively. As shown in FIG. 10, the circuit in this embodiment is composed of a constant voltage circuit 111 that generates a constant voltage Vref just like a band gap reference circuit; a resistor voltage dividing circuit 112 that generates such a compare voltage Vc as 0.2 V by dividing this constant voltage Vref; a comparator 113 that compares the generated compare voltage Vref with the power control signal voltage Vapc; and a differential amplifier 114.

The differential amplifier 114 in this embodiment is an ordinary one, which is composed of differential input transistors Q21 and Q22; active load transistors Q23 and Q24; and a constant current source 125, is further provided with a transistor Q26 disposed in parallel to one Q23 of the load transistors and the output voltage of the comparator 113 is applied to the base terminal of the Q26. Consequently, the power control signal voltage Vapc, when it is lower than the compare voltage Vrc (0.2V), drives the output of the comparator 113 low to turn on the transistor Q26 and pull up the potential of the output node of the differential amplifier 114 to Vdd to turn off the transistor Q13 of the current conversion circuit 12 shown in FIG. 7 so as to generate the dead band (DB) that drives the current Io to "0". On the other hand, the power control signal voltage Vapc, when it is higher than the compare voltage Vrc (0.2V), drives the output of the comparator 113 high to turn off the transistor Q26, thereby the differential amplifier 114 functions as an ordinary amplifier to output a voltage corresponding to the input voltage, which is the power control signal voltage Vapc. Consequently, the transistor Q13 of the current conversion circuit 12 shown in FIG. 7 comes to supply the current Io that is proportional to the power control signal voltage Vapc.

Figure 11:
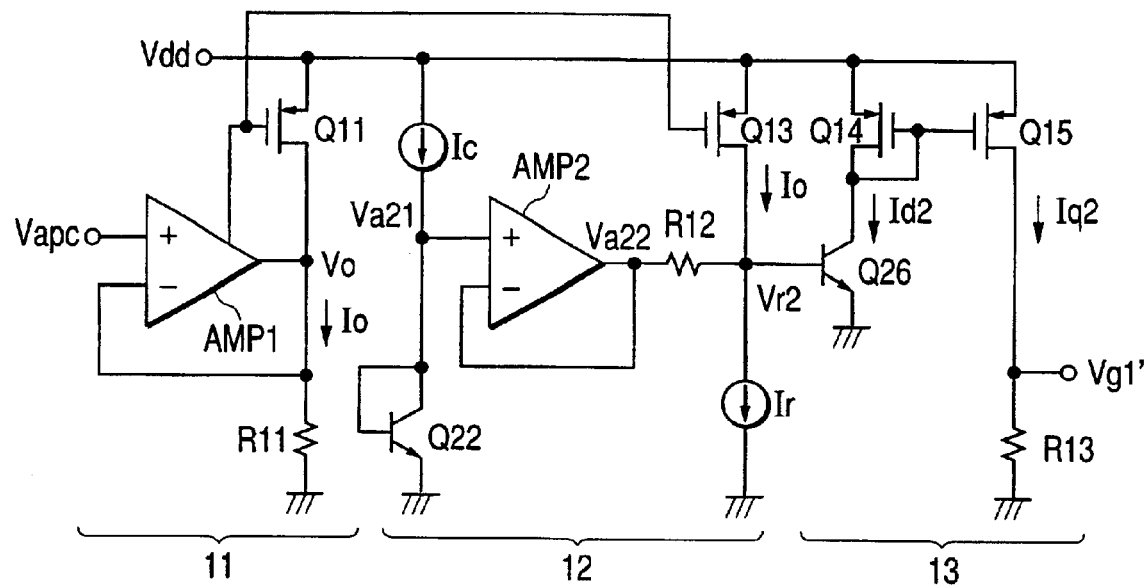
FIG. 11 is a circuit diagram of a concrete example of a bias control circuit in a high frequency power amplifier module in the third embodiment of the present invention.
Figure 12A:
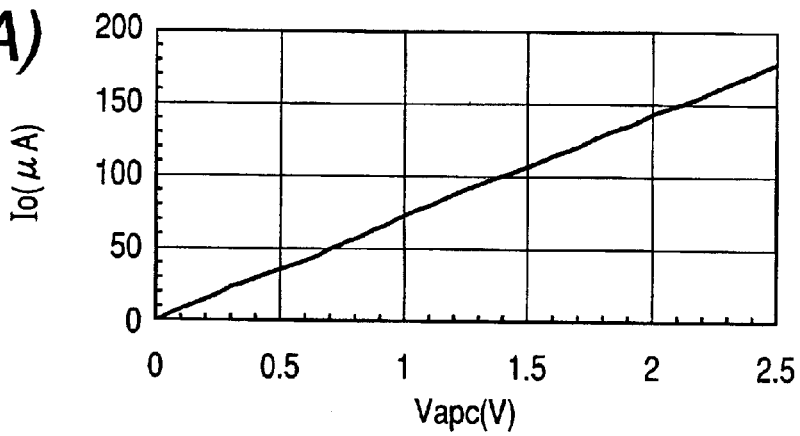
FIGS. 12A and 12B are graphs for denoting the characteristics of the operation of the bias control circuit shown in FIG. 11.

FIG. 11 shows a concrete circuit diagram of a bias control circuit (only the major part in one stage) in the high frequency power amplifier module in the third embodiment of the present invention. FIG. 12 shows a graph for denoting characteristics of the bias control circuit. The configuration of the bias control circuit shown in FIG. 11 is almost identical to that of the bias control circuit shown in FIG. 7. The bias control circuit shown in FIG. 11 has only a difference from that shown in FIG. 7; concretely, bipolar transistors Q22 and Q26 are used instead of the FETs Q12 and Q16 to compose the current buffer circuit 13.

Figure 12B:
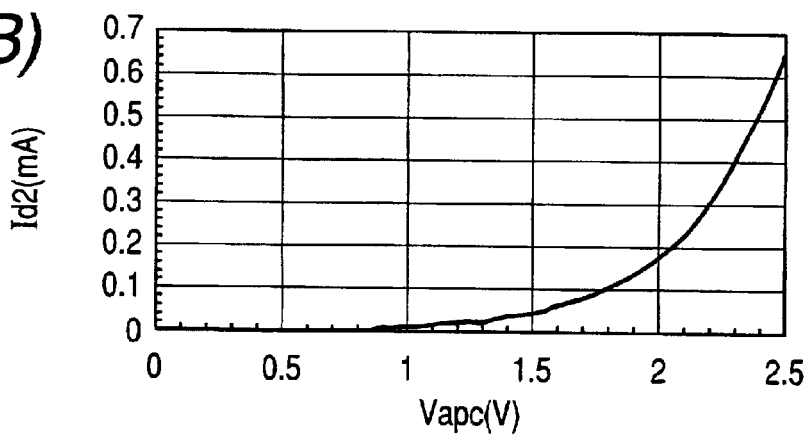

Generally, the collector current of respective bipolar transistors can be represented by an exponential function of the base voltage. In this embodiment, therefore, the collector current Id2 flowing in the transistor Q26 of the current buffer circuit 13 changes like an exponential function with respect to the change of the base potential Vr2, thereby the change curve becomes as shown in FIG. 12B. A current having the same characteristics as those of this current Id2 comes to flow in the output transistors Q1 to Q3. Because the bias current of the output transistors Q1 to Q3 is set as an exponential function such way in this embodiment, the change rate of the gate bias voltage can be reduced when the power control signal voltage Vapc is low and the change rate can be increased when the Vapc is high, thereby the controllability of the output power around the threshold voltage of the FETs can be improved.

Figure 13:
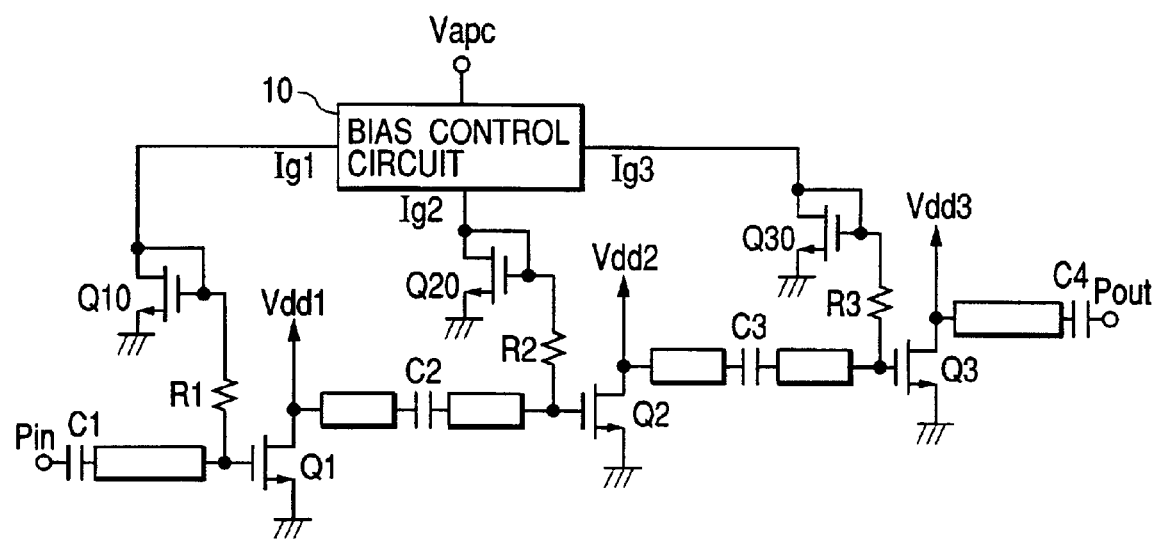
FIG. 13 is a circuit diagram of a high frequency power amplifier module in the fourth embodiment of the present invention.
Figure 14:
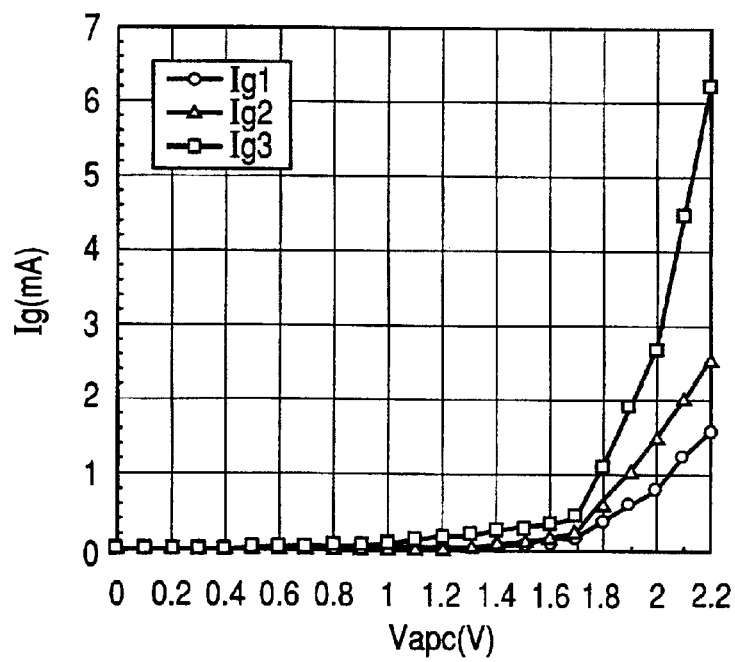
FIG. 14 is a graph for denoting a relationship between the power control signal voltage and the gate bias current in the high frequency power amplifier module in the fourth embodiment of the present invention.
Figure 15:
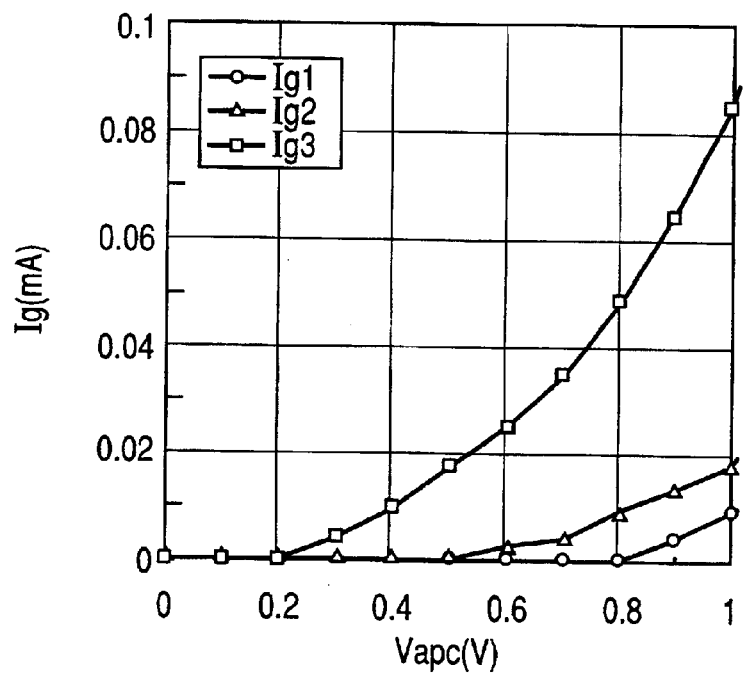
FIG. 15 is an expanded graph for denoting part of the graph shown in FIG. 14.

FIG. 13 shows a circuit diagram of the high frequency power amplifier module in the fourth embodiment of the present invention and FIG. 14 shows a graph of the characteristics of a bias control circuit of the module. FIG. 15 shows an expanded view of part (a portion where the Vapc is within 0 to 1V) of the graph shown in FIG. 14.

In this embodiment, the above described bias control circuit 10 is used as a current output circuit and FETs Q10, Q20, and Q30 are provided and connected to the output transistors Q1, Q2, and Q3 through current mirrors, so that the output transistors Q1 to Q3 are biased by the currents Ig1 to Ig3 flown in them from the bias control circuit 10 in accordance with the gate-drain current characteristics of the FETs.

The bias control circuit 10 in this embodiment is configured so as to generate a bias current with which the gate bias current in each stage (Ig1 to Ig3) changes with respect to the power control signal voltage (Vapc) in a relationship as shown in FIGS. 14 and 15 respectively. Concretely, the relationship between the power control signal voltage (Vapc) and the gate bias current in each stage (Ig1 to Ig3) satisfies Ig1<Ig2<Ig3 as shown in FIG. 14 in this embodiment. And, the Vapc is set so that the relationship of VI1>VI2>VI3 (ex., 0.8 V>0.5 V>0.2 V) is satisfied when the Vapc values are assumed as VI1, VI2, and VI3 while the gate bias currents of the 1st to 3rd FETs are 0 mA.

The relationship between the power control signal voltage Vapc and the output power Pout in the high frequency power amplifier module in this embodiment is the same as that of the high frequency power amplifier module in the first embodiment and the efficiency and the operating current, when the output power is 30 dBm and the output power is 0 dBm, are improved respectively just like the high frequency power amplifier module in the first embodiment.

Figure 16:
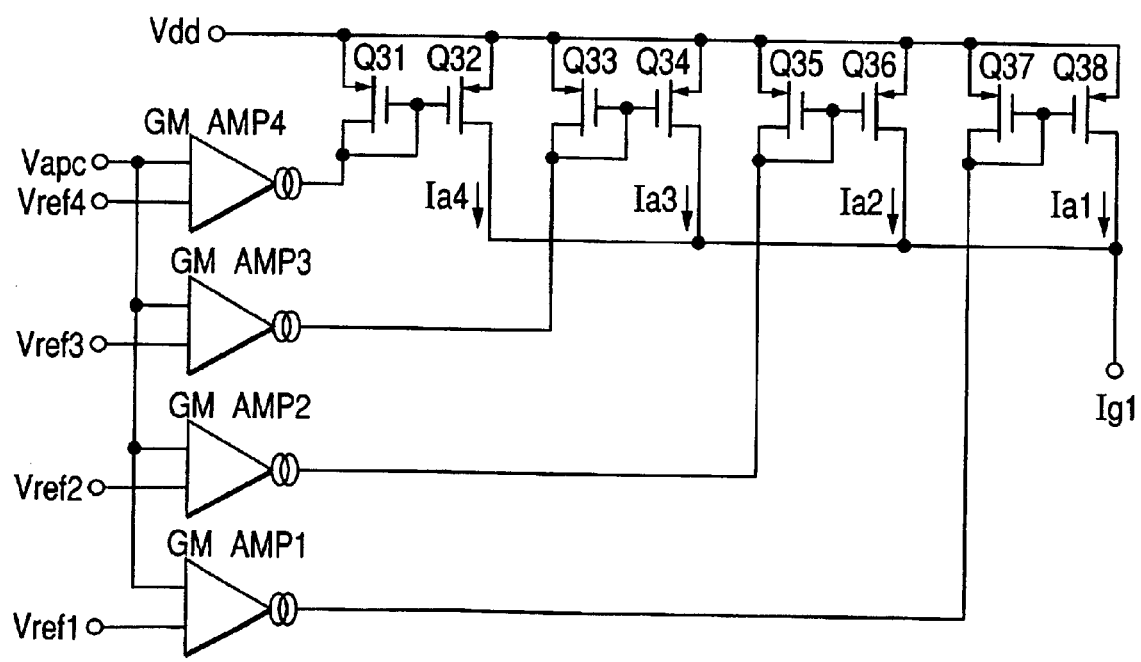
FIG. 16 is a circuit diagram of a concrete example of a bias control circuit in a high frequency power amplifier module in the fifth embodiment of the present invention.

FIG. 16 shows a concrete circuit diagram of the bias control circuit (only the major part in the first stage) in the high frequency power amplifier module in the fourth embodiment of the present invention and FIG. 17 shows a graph of the characteristics of the operation of the bias control circuit.

The bias control circuit in the high frequency power amplifier module in this embodiment, as shown in FIG. 16, is configured as a current output bias control circuit comprising voltage input current output type differential amplifier circuits (hereinafter, to be referred to as gm amplifiers) GM-AMP1 to GM-AMP4 used to input the power control signal voltage Vapc and the reference voltages Vref1 to Vref4, as well as FET pairs Q31 and Q32, Q33 and Q34, Q35 and Q36, and Q37 and Q38 used to compose current mirrors that flow currents Ia1 to Ia4 in accordance with the input voltage Vapc with use of the gm amplifiers.

The above described reference voltages are set so as to satisfy the relationship of Vref1<Vref2<Vref3<Vref4. Each of the gm amplifiers GM-AMP1 to GM-AMP4 is configured so that those gains (current amplification rates) G1 to G4 satisfy the relationship of G1<G2<G3<G4.

Figure 17A:
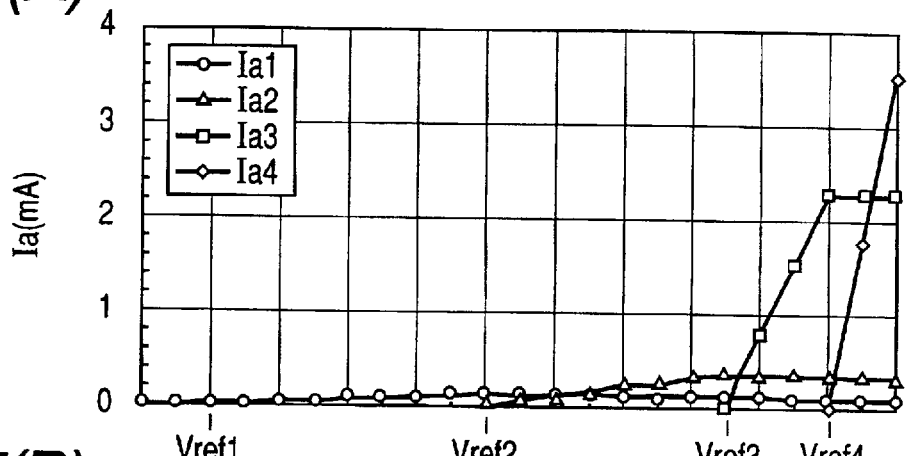
FIGS. 17A and 17B are graphs for denoting the characteristics of the operation of the bias control circuit shown in FIG. 16.
Figure 17B:
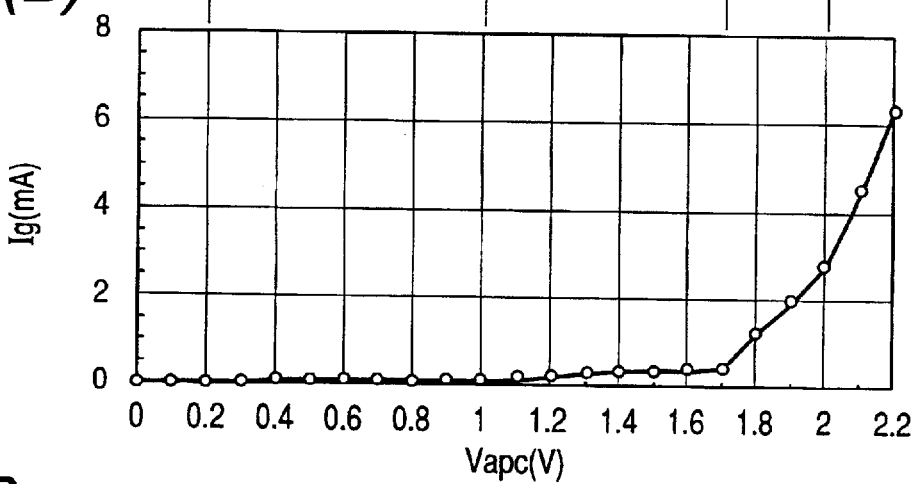

In the bias control circuit in this embodiment, as shown in FIG. 17A, the current Ia1/Ia2/Ia3/Ia4 of each current mirror circuit increases in proportion to the Vapc until a corresponding reference voltage Vref1/Vref2/Vref3/Vref4 is reached. After that, the gm amplifier functions so as to increase the output of the bias control circuit in accordance with the gm characteristics, thereby the current Ia1/Ia2/Ia3/Ia4 is added to the output. The result is then output as the hate bias current Ig1. Consequently, the change rate of the gate bias current Ig1, as shown in FIG. 17B, changes step by step according to the power control signal voltage Vapc.

Then, this gate bias current Ig1, just like in the first embodiment shown in FIG. 13, flows in the transistor Q10 as a drain current, thereby the output transistor Q1 is driven at predetermined operation characteristics. The bias circuits for other output transistors Q2 and Q3 also function similarly; the reference voltage Vref1/Vref2/Vref3/Vref4 inputted to the amplifier is varied for each of the output transistors Q1 to Q3 to adjust the operation characteristics so as to drive the circuit to obtain a desired output most efficiently.

Figure 18:
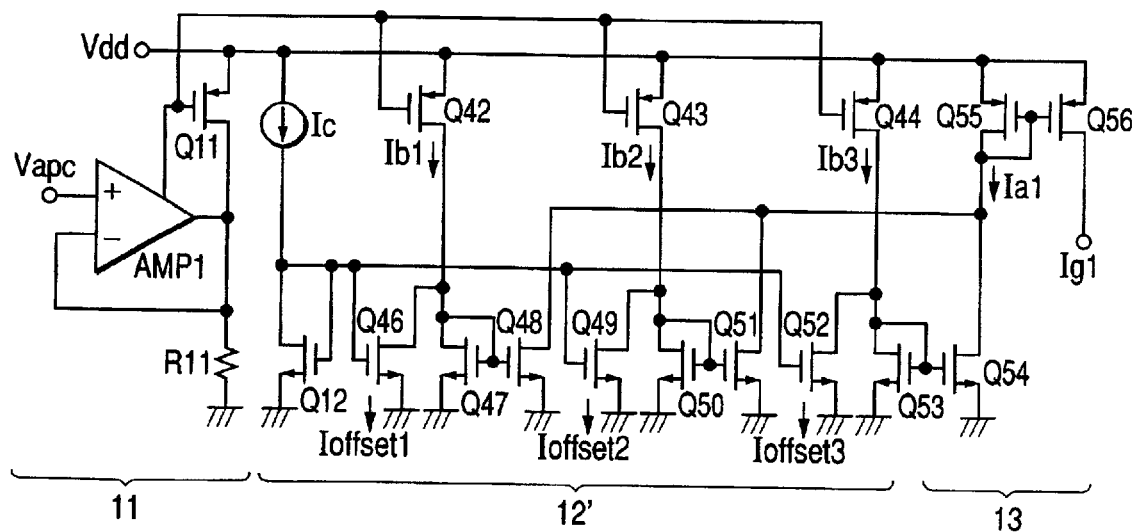
FIG. 18 is a circuit diagram of a concrete example of a bias control circuit in a high frequency amplifier module in the sixth embodiment of the present invention.

FIG. 18 shows a concrete circuit diagram of another bias circuit (only the major portion in one stage) in the high frequency power amplifier module of the present invention. The bias control circuit in this embodiment is a variation of the current conversion circuit 12 located in the bias control circuit in the first embodiment shown in FIG. 7. Concretely, the current conversion circuit 12 is replaced with a current synthesizing circuit 12' composed of a plurality of current mirror circuits as shown in FIG. 18.

Concretely, the bias control circuit shown in FIG. 18 is composed of transistors Q42 to Q44 paired with the transistor Q11 to form a current mirror respectively and flows the current Io according to the output current of the voltage-current conversion circuit 11, transistors Q46, Q49, and Q52 connected serially to each of those transistors Q42 to Q44 and paired with the transistor Q12 to form a current mirror and connected to the constant current source Ic serially through a diode, transistors Q47, Q50, and Q53 connected to each of those transistors Q46, Q49, and Q52 in parallel and to the transistors Q42 to Q44 serially, and transistors Q48, Q51, and Q54 connected to each of those transistors Q47, Q50, and Q53 so as to form a current mirror respectively.

The current Ia1 to which the drain currents of the transistors Q48, Q51, and Q54 are added is flown in the transistor Q14 of the current buffer circuit 13, transferred to the transistor Q15, then the drain current of the Q15 is output as a bias current Ig1. The drain currents of the transistors Q48, Q51, and Q54 are obtained by subtracting the drain currents Ioffset1, Ioffset2, and Ioffset3 of the transistors Q46, Q49, and Q52 from the drain currents Ib1, Ib2, and Ib3 of the transistors Q42, Q43, and Q44 that flow a current in proportion to the control voltage Vapc respectively.

In the bias control circuit in this embodiment, for example, the FETs Q47, Q48, Q50, and Q53 are formed in the same size and the FET Q51 is about 20 times the Q47, and the FET Q54 about 27 times the Q47. Consequently, in the bias control circuit in this embodiment, when the current Ib1/Ib2/Ib3 of the FET Q42/Q43/Q44, which is a current mirror circuit, reaches its predetermined offset current Ioffset1/Ioffset2/Ioffset3, a current flows in each of the FETs Q48, Q51, and Q54 and the current Ia1 to which those currents are added is amplified by the current mirror circuit composed of the FETs Q55 and Q56 according to the ratio between the sizes of the Q55 and the Q56, then output as a desired gate bias current Ig1. Even in such configuration, it is possible to generate the gate bias currents Ig1 to Ig3 whose change rates change step by step according to the power control signal voltage Vapc just like the case shown in FIG. 17B.

Figure 26:
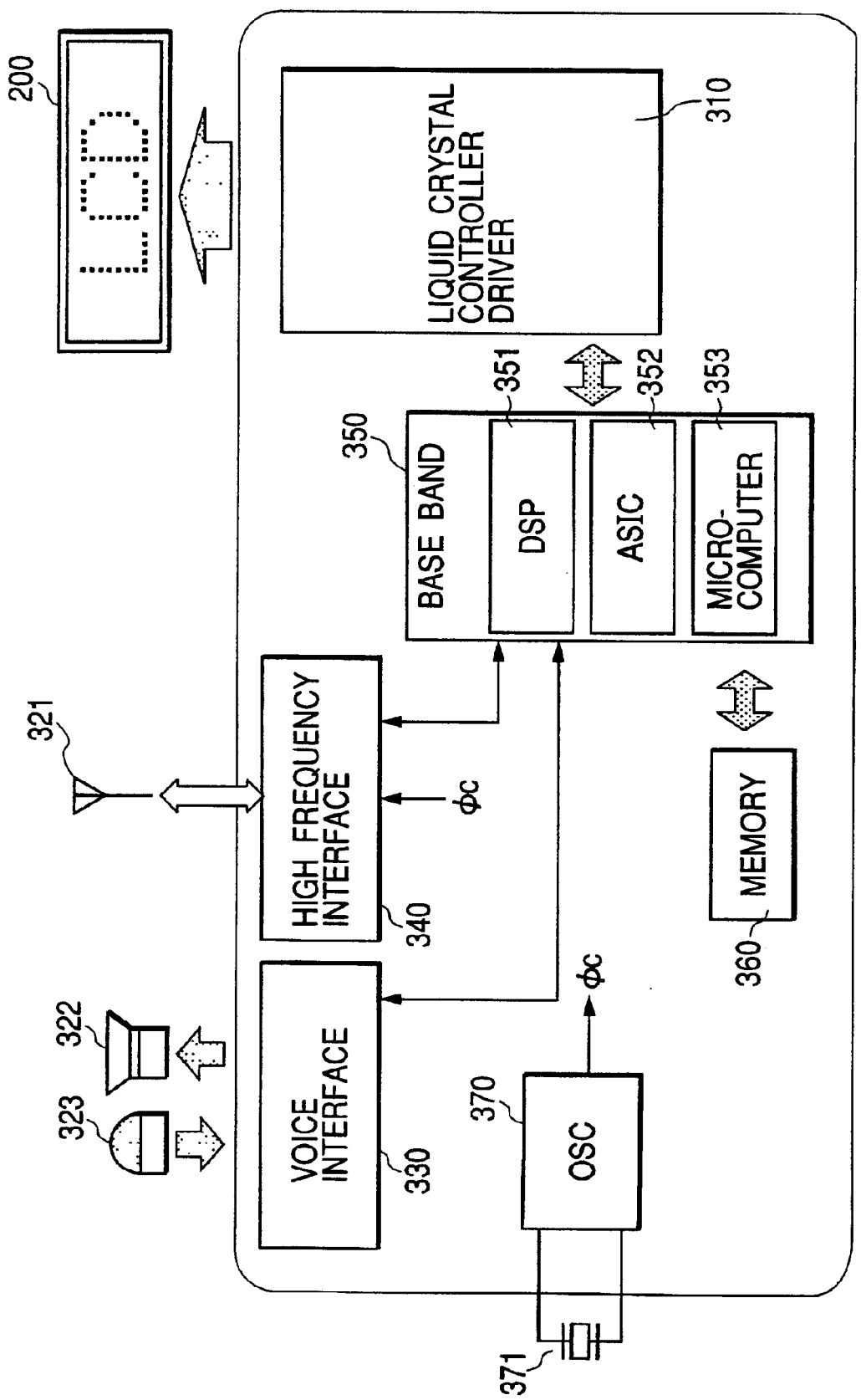
FIG. 26 is an entire block diagram of a portable telephone that employs the high frequency amplifier circuit device in an embodiment.

FIG. 26 shows a block diagram of the whole portable telephone that employs the high frequency power amplifier circuit module in the above embodiment.

The portable telephone in this embodiment is composed of a liquid crystal panel 200 used as a display part, a transmission/receiving antenna 321, a voice speaker 322, a voice microphone 323, a liquid crystal control driver 310 to drive the liquid crystal panel 200 to display data, a high frequency interface 340 that uses the GSM method or the like to communicate with another portable telephone via the antenna 321, a DSP (Digital Signal Processor) 351 used to process voice and sending/receiving signals, an ASIC (Application Specific Integrated Circuits) 352 that supplies customizing functions (user logics), a system controller 353 composed of a microprocessor or microcomputer, etc. for controlling the whole apparatus including the display, a storage memory 360 for storing data and programs, an oscillation circuit (OSC) 370, etc. The DSP 351, the ASIC 352, and the microcomputer 353 used as a system controller are combined to compose a so-called base band part 350. The high frequency power amplifier module in the above embodiment is used for a transmission output part of the high frequency interface 340.

While the present invention has been described concretely on the basis of the preferred embodiments, the present invention is not limited only to those embodiments. It is to be understood that modifications will be apparent to those skilled in the art without departing from the spirit of the invention. For example, although output transistors are connected in a cascade in three stages in the above embodiments, they may be connected in two stages or four or more stages. While the output transistor Q3 in the last stage and the transistor Q30 paired with the Q3 respectively to form a current mirror is formed on another chip, the transistor Q30 may be formed together with a bias circuit on the same chip just like other output transistors Q1 and Q2. On the contrary, the output transistor Q1 and the transistor Q10 paired with the Q1 to form a current mirror, as well as the output transistor Q2 and the transistor Q20 paired with the Q2 respectively to form a current mirror may also be formed on another chip.

Although a description has been made for a high frequency power amplifier circuit device used for a radio communication apparatus, which is an application field of the present invention, the present invention may also apply widely to a multistage amplifier circuit in which a plurality of semiconductor amplification elements are connected in a cascade and a system that includes such the amplifier circuit.

The typical effects of the present invention disclosed in this specification will be able to be summarized as follows:

(1) The high frequency power amplifier circuit device of the present invention, provided with multiple output stages composed by a plurality of output semiconductor amplification elements connected in cascade respectively and a bias control circuit that drives the plurality of output semiconductor amplification elements according to a control voltage, can ease sudden changes of the output power caused by the control voltage, thereby improving the controllability of the output power, since the bias control circuit can control the output semiconductor amplification elements so that the bias voltage decreases in an area around the threshold voltage where the gain of each of the output semiconductor amplification elements changes significantly and the bias voltage increases in an area away from the threshold voltage where the gain of each of the output semiconductor amplification elements changes less.

(2) The bias conditions (a bias starting point and a bias voltage change level) of the output semiconductor amplification element in each stage can be set at a predetermined balance and the output semiconductor amplification element in the last stage can be driven very efficiently, so that the efficiency of the amplifier circuit at a low power output can be improved, thereby the operating current is reduced.

(3) As a result, in a portable telephone that uses the high frequency power amplifier circuit device of the present invention, the talking time and the battery operating life can be extended.

What is claimed is:

1. A high frequency power amplifier circuit device having multiple output stages, each including a plurality of first semiconductor amplification elements connected in a cascade and a bias control circuit that drives each of said plurality of first semiconductor amplification elements according to an inputted control voltage, wherein said bias control circuit applies an initial bias voltage to the control terminal of each of said plurality of first semiconductor amplification elements, thereby supplying a current to said semiconductor amplification element even when said input control voltage is practically "0", wherein said initial bias voltage applied to each of said plurality of first semiconductor amplifier elements is controlled so as to become higher gradually from the first stage to the last stage, and wherein the change rate of said bias voltage applied to said control terminal of each of said plurality of first semiconductor amplification elements is controlled so as to become lower gradually from the first stage to the last stage until the first voltage becomes higher than the threshold voltage of said semiconductor amplification elements and higher gradually from the first stage to the last stage when said first voltage is exceeded.

2. The high frequency power amplifier circuit device according to claim 1, wherein the change rate of said bias voltage applied to the control terminal of each of said plurality of first semiconductor amplification elements is controlled so as to become higher when a second voltage becomes higher than said first voltage.

3. The high frequency power amplifier circuit device according to claim 1, wherein said first voltage is 0.1 to 0.5 V higher than said threshold voltage of said first semiconductor amplification elements.

4. The high frequency power amplifier circuit device according to claim 3, wherein said bias control circuit controls said bias voltage applied to each of said first semiconductor amplification elements to "0" practically until said input control voltage reaches a third voltage lower than said first voltage, then applies a predetermined initial bias voltage to said first semiconductor amplification elements after said control voltage reaches said third voltage, thereby flowing a current to each of said first semiconductor amplification elements.

5. The high frequency power amplifier circuit device according to claim 4, wherein said bias control circuit includes:

a voltage-current conversion circuit that converts said control voltage to a current;

a first resistor that converts said current supplied from said voltage-current conversion circuit to a voltage;

a control voltage generation circuit that includes a first constant current source and a second semiconductor amplification element connected serially to said first constant current source and enabled to generate a voltage equivalent to a threshold voltage of said second semiconductor amplification element;

a third semiconductor amplification element that generates a current according to a synthesized voltage of said voltage generated by said control voltage generation circuit and said voltage converted by said first resistor;

a second constant current source connected to the control terminal of said third semiconductor amplification element and enabled to pull in a current supplied from said voltage-current conversion circuit;

a current buffer that supplies a current having the same characteristics as those of the current flowing in said third semiconductor amplification element; and current-voltage conversion means that converts a current flowing in said current buffer circuit to a voltage to drive said first semiconductor amplification elements, wherein the current of said second constant current source is varied among said first semiconductor amplification elements, thereby the control voltage level on which a current begins flowing in each of said first semiconductor amplification elements is varied among said first semiconductor amplification elements.

6. The high frequency power amplifier circuit device according to claim 4, wherein said device includes a plurality of semiconductor amplifier elements, each being connected to one of said plurality of first semiconductor amplification elements, thereby forming a current mirror circuit, wherein said bias control circuit is composed of:
a voltage-current conversion circuit that converts said control voltage to a current;
a first resistor that converts a current supplied from said voltage-current conversion circuit to a voltage;
a control voltage generation circuit provided with a first constant current source, as well as a second semiconductor amplification element connected serially to said first constant current source and enabled to generate a voltage equivalent to the threshold voltage of said second semiconductor amplification element;
a third semiconductor amplification element that generates a current according to a synthesized voltage of said voltage generated by said control voltage generation circuit and said voltage converted by said first resistor; and
a second constant current source connected to the control terminal of said third semiconductor amplification element and enabled to pull in a current supplied from said voltage-current conversion circuit, wherein said bias control circuit supplies a current to each of said semiconductor amplification elements connected to one of said first semiconductor amplification elements to form a current mirror circuit so as to drive said first semiconductor elements, said current having the same characteristics as those of the current flowing in said third semiconductor amplification element, and wherein the current supplied from said second constant current source is set so as to be different among said plurality of first semiconductor amplification elements, thereby a control voltage level on which said current begins flowing in each of said first semiconductor amplification elements comes to differ from others.

7. The high frequency power amplifier circuit device according to claim 2, wherein said bias control circuit includes a plurality of first current sources, each supplying a current in proportion to a control voltage and a plurality of second current sources, each supplying a current different from others regardless of said control voltage, and wherein a synthesized control current is generated by subtracting the current generated by each of said plurality of second current sources from the current generated by its corresponding one of said plurality of first current sources, then converting said synthesized current to a voltage used to drive one of said plurality of first semiconductor amplification elements or supplying a current having practically the same characteristics as those of said control current supplied to said first semiconductor amplification element so as to drive said element, thereby changing said bias change rate according to said control voltage.

8. The high frequency power amplifier circuit device according to claim 2, wherein said bias control circuit includes a plurality of differential amplifier circuits, each receiving a common control voltage via one input terminal and first and second voltages via another input terminal as compare voltages, as well as a plurality of current circuits, each supplying a current according to the output of each of said plurality of differential amplifier circuits, and wherein said plurality of first semiconductor amplification elements are driven with a voltage converted from a current generated by synthesizing the currents supplied from said plurality of current circuits or driven with a current having practically the same characteristics as those of said synthesized current, thereby said bias change rate is changed in accordance with said control voltage.

9. The high frequency power amplifier circuit device according to claim 4, wherein said voltage-current conversion circuit includes a differential amplifier circuit that receives said control voltage via one input terminal thereof and a comparison circuit that detects whether or not said control voltage has reached said predetermined voltage, and wherein a switch element is provided in parallel to a load element of said differential amplification circuit and said switch element is turned on/off by an output of said comparison circuit, thereby no current is flown to said first semiconductor amplification elements until said control voltage reaches a predetermined voltage and a predetermined initial bias voltage is applied to said first semiconductor amplification elements so as to flow a current in each of them after said control voltage reaches said predetermined voltage.

* * * * *